US012379425B2

(12) United States Patent
Honda et al.

(10) Patent No.: US 12,379,425 B2
(45) Date of Patent: Aug. 5, 2025

(54) BATTERY MONITORING DEVICE

(71) Applicant: DENSO CORPORATION, Kariya (JP)

(72) Inventors: Kazutaka Honda, Kariya (JP); Yukihiro Tomonaga, Kariya (JP); Shunichi Kubo, Kariya (JP)

(73) Assignee: DENSO CORPORATION, Kariya (JP)

( * ) Notice: Subject to any disclaimer, the term of this patent is extended or adjusted under 35 U.S.C. 154(b) by 206 days.

(21) Appl. No.: 18/320,465

(22) Filed: May 19, 2023

(65) Prior Publication Data

US 2023/0288491 A1 Sep. 14, 2023

Related U.S. Application Data

(63) Continuation of application No. PCT/JP2021/046289, filed on Dec. 15, 2021.

(30) Foreign Application Priority Data

Dec. 17, 2020 (JP) ................................ 2020-209289

(51) Int. Cl.

*G01R 31/396* (2019.01)
*G01R 31/3835* (2019.01)
*H02J 7/00* (2006.01)

(52) U.S. Cl.

CPC ....... *G01R 31/396* (2019.01); *G01R 31/3835* (2019.01); *H02J 7/0047* (2013.01)

(58) Field of Classification Search

None

See application file for complete search history.

(56) References Cited

U.S. PATENT DOCUMENTS

| | | | | |
|---|---|---|---|---|
| 9,878,633 | B2 | 1/2018 | Hwang | |
| 2015/0054519 | A1 | 2/2015 | Tomonaga et al. | |
| 2015/0070023 | A1 | 3/2015 | Kudo et al. | |
| 2016/0226107 | A1* | 8/2016 | Worry | H01M 10/482 |
| 2017/0261562 | A1* | 9/2017 | Honda | G01R 31/396 |
| 2019/0041463 | A1 | 2/2019 | Honda et al. | |

FOREIGN PATENT DOCUMENTS

| | | | |
|---|---|---|---|
| JP | 2002-062341 | A | 2/2002 |
| JP | 2017-032311 | A | 2/2017 |
| JP | 2017-096723 | A | 6/2017 |

* cited by examiner

*Primary Examiner* — Jas A Sanghera

(74) *Attorney, Agent, or Firm* — Posz Law Group, PLC

(57) ABSTRACT

A battery monitoring device for monitoring an assembled battery having multiple battery cells includes: a range specifying unit that specifies a detection range; a voltage detection unit that detects a voltage of each battery cell in the detection range, includes an A/D converter for inputting a voltage corresponding to the voltage of each battery cell and a digital filter for inputting a digital signal output from the A/D converter and functioning as a low pass filter, and outputs an output signal of the digital filter as a detection signal representing a detection result of the voltage of each battery cell; and a characteristic setting unit that sets a characteristic of the digital filter.

10 Claims, 13 Drawing Sheets

| DET RANGE | APPLICABLE BAT CELL |
|---|---|
| 4.5−5.0V | — |
| 4.0−4.5V | — |
| 3.5−4.0V | Cb2−Cb24 |
| 3.0−3.5V | Cb1 |
| ⋮ | — |
| 0−0.5V | — |

BATTERY MONITORING DEVICE

CROSS REFERENCE TO RELATED APPLICATIONS

The present application is a continuation application of International Patent Application No. PCT/JP2021/046289 filed on Dec. 15, 2021, which designated the U.S. and claims the benefit of priority from Japanese Patent Application No. 2020-209289 filed on Dec. 17, 2020. The entire disclosures of all of the above applications are incorporated herein by reference.

TECHNICAL FIELD

The present disclosure relates to a battery monitoring device for monitoring an assembled battery in which a plurality of battery cells are connected in series.

BACKGROUND

According to a conceivable technique, a battery monitoring device estimates the SOC of each battery cell, and performs various battery-related controls such as equalization processing based on the estimation result. Note that SOC is an index representing the state of charge of the battery, and is an abbreviation for State Of Charge. The battery monitoring device is provided with a voltage detection unit that detects the voltage of each battery cell, and estimates the SOC based on the voltage value detected by the voltage detection unit. The voltage detection for estimating the SOC is performed in a wide range from the voltage when the SOC is considered to be 0% to the voltage when the SOC is considered to be 100%.

SUMMARY

According to an example, a battery monitoring device for monitoring an assembled battery having multiple battery cells may include: a range specifying unit that specifies a detection range; a voltage detection unit that detects a voltage of each battery cell in the detection range, includes an A/D converter for inputting a voltage corresponding to the voltage of each battery cell and a digital filter for inputting a digital signal output from the A/D converter and functioning as a low pass filter, and outputs an output signal of the digital filter as a detection signal representing a detection result of the voltage of each battery cell; and a characteristic setting unit that sets a characteristic of the digital filter.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
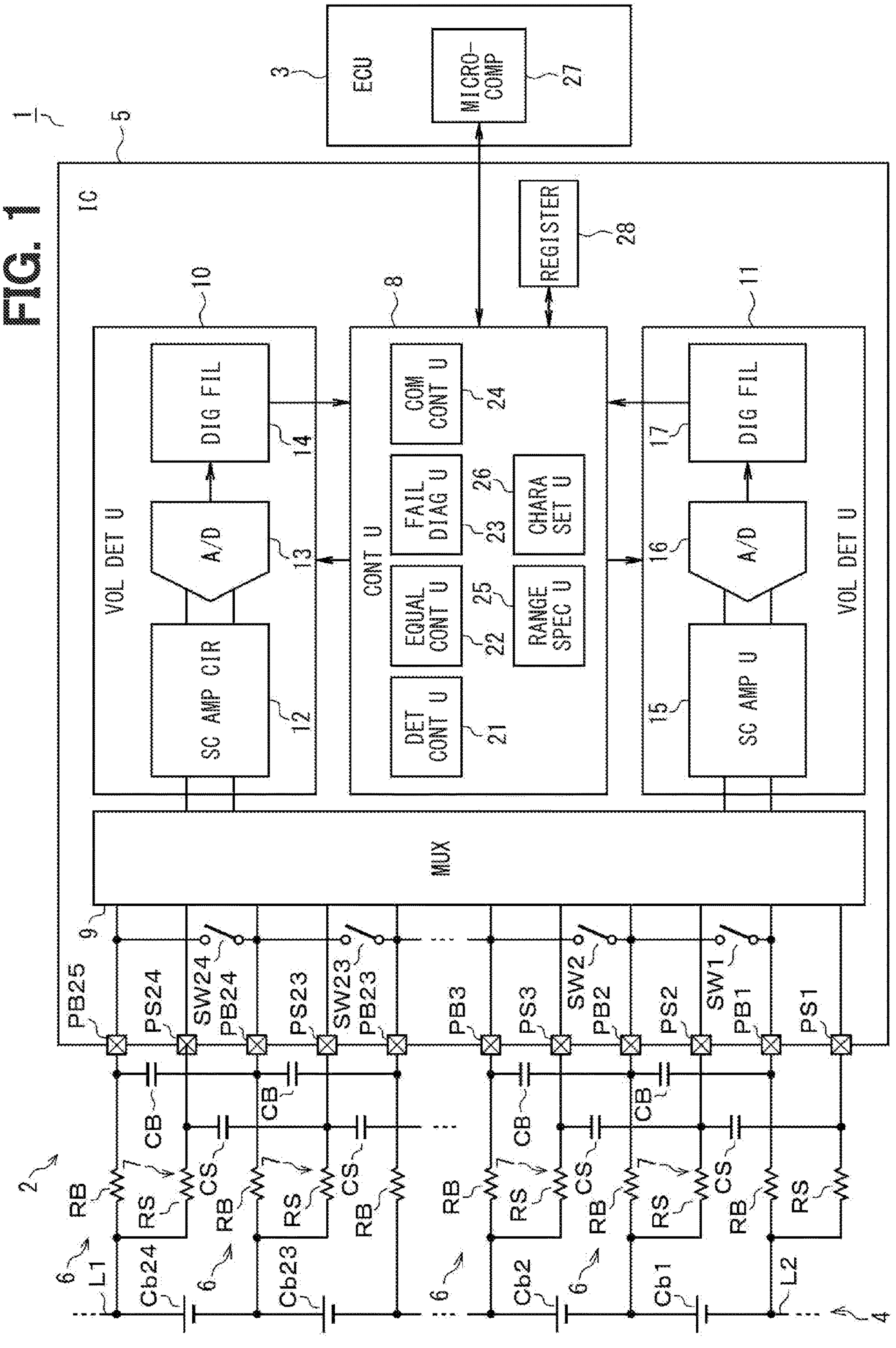
FIG. 1 is a diagram schematically showing the configuration of a battery monitoring system according to a first embodiment.

In the battery monitoring device according to a conventional technique, as described above, since the battery cell voltage is detected over a wide area, there may be a limit to the accuracy of the voltage detection. Thu, it may be difficult to increase the estimation accuracy of the SOC sufficiently. In particular, when the detection target is a battery such as an LFP battery in which the relationship between the SOC and the OCV is flat in many areas, the accuracy of the SOC estimation may decrease to the extent that it is practically insufficient. LFP is an abbreviation for lithium iron phosphate, and OCV is an abbreviation for Open Circuit Voltage.

A decrease in the accuracy of SOC estimation leads to the following difficulties. That is, since the battery monitoring device performs equalization based on the estimated SOC, there may be a possibility that the equalization cannot be performed normally if the SOC estimation accuracy is low. In addition, the lower the accuracy of SOC estimation, the more margins must be secured in the safe usage range of the battery set to prevent over-discharging and over-charging. Thus, a difficulty may arise that the usage allowable range of the battery is small, and the amount of batteries mounted in the vehicle is increased.

An object of the present embodiments is to provide a battery monitoring device capable of improving the accuracy of battery cell voltage detection.

In one aspect of the present embodiments, a battery monitoring device is a battery monitoring device that monitors an assembled battery having a configuration in which a plurality of battery cells are connected in series, and includes a range specifying unit, a voltage detection unit, and a characteristic setting unit. The range specifying unit specifies a detection range, which is a range for detecting the voltage of the battery cell. The voltage detection unit detects the voltage of the battery cell within a detection range, and includes a digital filter that functions as a low-pass filter, and receives a signal from an A/D converter that inputs a voltage corresponding to the voltage of the battery cell and a digital signal that is output from the A/D converter. The voltage detection unit outputs the output signal of the digital filter as a detection signal representing the detection result of the voltage of the battery cell. The characteristic setting unit sets the characteristic of the digital filter.

According to the above configuration, the detection range of the voltage of the battery cell can be selectively set to be any desired range from a wide range that is a wide area covering the entire voltage range of the battery cell to a narrow range that is a limited narrow range of the entire voltage range. Further, according to the above configuration, a desired characteristic can be selectively set as the characteristic of the digital filter. In this way, the voltage of the battery cell can be detected after setting an appropriate detection range and appropriate digital filter characteristics according to various conditions. Therefore, according to the above configuration, it is possible to obtain an excellent effect that the accuracy of voltage detection of the battery cells can be improved.

The following will describe embodiments of the present disclosure with reference to the accompanying drawings. In each embodiment, the substantially same components are denoted by the same reference numerals and description thereof will be omitted.

First Embodiment

The following will describe a first embodiment with reference to FIG. 1 to FIG. 13.

<Overall Configuration>

As shown in FIG. 1, a battery monitoring system 1 of this embodiment is mounted on a vehicle such as an automobile, and includes a battery monitoring device 2, an electronic control device 3, and the like. In this specification, the electronic control device may be abbreviated as ECU. The ECU 3 is an example of an external control device. The battery monitoring device 2 is a device that monitors the state of the assembled battery 4 by detecting various conditions such as the voltage of the assembled battery 4.

The battery monitoring device 2 includes a battery monitoring IC 5, which is an integrated circuit in which circuits that perform various operations for battery monitoring are integrated, and a plurality of external elements provided outside the battery monitoring IC 5. IC is an abbreviation for integrated circuit. The assembled battery 4 is mounted in a vehicle such as an automobile, for example, and has a configuration in which a plurality of, for example, 24 battery cells Cb are connected in series in multiple stages between a pair of DC power supply lines L1 and L2. In this case, the battery cell Cb is, for example, a secondary battery such as a lithium ion battery, a fuel cell, or the like.

In addition, in FIG. 1, four battery cells Cb out of the 24 battery cells Cb are shown, and in order to distinguish these four battery cells Cb, numerals are attached to the end of the reference numerals. This number corresponds to the arrangement of the battery cells Cb in the assembled battery 4, with 1 being given to the battery cell Cb arranged on the lowest potential side, and with 2, 3, 4 and so on being given as it progresses toward the higher potential side, and with 24 being given to the battery cell Cb arranged on the highest potential side. Therefore, in FIG. 1, a battery cell Cb1 arranged on the lowest potential side, a battery cell Cb2 arranged on the second low potential side, a battery cell Cb23 arranged on the second high potential side, and a battery cell Cb24 arranged on the highest potential side are shown.

Each component provided in the battery monitoring device 2 corresponding to each of these four battery cells Cb1, Cb2, Cb23, and Cb24 may also be distinguished by adding the same number at the end of the reference numeral. Here, in a case where there is no need to distinguish these configurations, the respective configurations will be collectively referred to by omitting the numbers at the ends. In the above configuration, a common mode voltage is superimposed on the battery cell Cb. This common mode voltage becomes higher toward the battery cell Cb connected to the upper stage side of the assembled battery 4, that is, to the high potential side, and its maximum value is a relatively high voltage of about several hundred volts, for example.

<Structure of External Element>

First, the configuration of external elements provided outside the battery monitoring IC 5 will be described. A high-potential terminal of the battery cell Cb24 is connected to the connection terminal PB25 via the resistor RB, and is connected to the connection terminal PS24 via the resistor RS. The low potential side terminal of the battery cell Cb24 and the high potential side terminal of the battery cell Cb23 are connected to the connection terminal PB24 via the resistor RB and connected to the connection terminal PS23 via the resistor RS.

A capacitor CB is connected between the connection terminal PB25 and the connection terminal PB24. A capacitor CS is connected between the connection terminal PS24 and the connection terminal PS23. The low potential side terminal of the battery cell Cb23 and the high potential side terminal of the battery cell Cb22 (not shown) are connected to the connection terminal PB23 via the resistor RB. A capacitor CS is connected between the connection terminal PS23 and the connection terminal PS22 (not shown).

A high-potential terminal of the battery cell Cb2 is connected to the connection terminal PB3 via the resistor RB, and is connected to the connection terminal PS3 via the resistor RS. The low potential side terminal of the battery cell Cb2 and the high potential side terminal of the battery cell Cb1 are connected to the connection terminal PB2 via the resistor RB and connected to the connection terminal PS2 via the resistor RS. A capacitor CB is connected between the connection terminal PB3 and the connection terminal PB2. A capacitor CS is connected between the connection terminal PS3 and the connection terminal PS2. A low-potential terminal of the battery cell Cb1 is connected to the connection terminal PB1 via the resistor RB, and is connected to the connection terminal PS1 via the resistor RS.

A capacitor CB is connected between the connection terminal PB2 and the connection terminal PB1. A capacitor CS is connected between the connection terminal PS2 and the connection terminal PS1. In the above configuration, the two resistors RB and the capacitor CB corresponding to each battery cell Cb constitute the filter 6, which is a so-called pi-type low-pass filter. In this specification, the low-pass filter may be abbreviated as LPF. In the above configuration, the two resistors RS and the capacitor CS corresponding to each battery cell Cb constitute the filter 7, which is a so-called pi-type LPF. That is, in the above configuration, the filters 6 and 7 are provided so as to correspond to the respective battery cells Cb.

<Internal Configuration of Battery Monitoring IC>

Next, the internal configuration of the battery monitoring IC 5 will be described. An equalization switch SW is provided corresponding to each of the plurality of battery cells Cb. The equalization switch SW includes, for example, a MOS transistor, and constitutes a discharge circuit together with the resistor RB. On/off of the equalization switch is controlled by the control unit 8. The control unit 8 controls overall operation of the battery monitoring IC 5. In the battery equalization process, the operation of each discharge circuit is controlled so that the voltage of each battery cell Cb is approximately the same as the voltage of the lowest battery cell Cb.

A specific connection form of the equalization switch SW is described as follows. That is, the equalization switch SW24 corresponding to the battery cell Cb24 is connected between the connection terminal PB25 and the connection terminal PB24. The equalization switch SW23 corresponding to the battery cell Cb23 is connected between the connection terminal PB24 and the connection terminal PB23. The equalization switch SW2 corresponding to the battery cell Cb2 is connected between the connection terminal PB3 and the connection terminal PB2. The equalization switch SW1 corresponding to the battery cell Cb1 is connected between the connection terminal PB2 and the connection terminal PB1.

The multiplexer 9 receives the voltages of the connection terminals PB1 to PB25, and selectively outputs two voltages from the input voltages that are required to detect the voltage of the battery cell Cb as a detection target to the voltage detection unit 10. In this specification, a multiplexer may be abbreviated as MUX. Further, the MUX 9 receives the voltages of the connection terminals PS1 to PS24, and selectively outputs two voltages from input voltages that are required for detecting the voltage of the battery cell Cb as the detection target to the voltage detection unit 11.

The voltage detection unit 10 is a normal system voltage detection unit that mainly performs normal voltage detection, and corresponds to a first voltage detection unit. The voltage detection unit 10 detects the voltage of the battery cell Cb within a detection range specified by the control unit 8, and includes a switched capacitor amplifier circuit 12 and an A/D converter 13, and a digital filter 14 which are controlled by the control unit 8. In this specification, the switched capacitor may be abbreviated as SC, and the A/D converter may be abbreviated as ADC.

The SC amplifier circuit 12 receives the voltage of the battery cell Cb supplied via the filter 7 and the MUX 9, and the like, and outputs a voltage obtained by amplifying the input voltage. In this case, the SC amplifier circuit 12 also performs a level shift to step down a high common mode voltage to a low common mode reference voltage. The output voltage of the SC amplifier circuit 12 corresponds to the voltage of the battery cell Cb. The ADC 13 receives the output voltage of the SC amplifier circuit 12, performs A/D conversion, and outputs a digital signal obtained as a result of the conversion.

The digital filter 14 functions as an LPF that receives the digital signal output from the ADC 13 and removes its high frequency components. The characteristics of the digital filter 14, such as the cutoff frequency and the order, are variable, and the control unit 8 sets these values. The voltage detection unit 10 configured as described above outputs the output signal of the digital filter 14 to the control unit 8 as a detection signal representing the detection result of the voltage of the battery cell Cb.

The voltage detection unit 11 is a diagnostic system voltage detection unit that mainly performs voltage detection for diagnosis, and corresponds to a second voltage detection unit. The voltage detection unit 11 detects the voltage of the battery cell Cb within the detection range specified by the control unit 8, and includes an SC amplification circuit 15, an ADC 16 and a digital filter 17 having the same configuration as each of the SC amplification circuit 12, the ADC 13, and the digital filter 14. That is, the voltage detection unit 11 has the same configuration as voltage detection unit 10. in this case, the SC amplifier circuit 15 receives the voltage of the battery cell Cb supplied via the filter 6 and the MUX 9, and the like, and outputs a voltage obtained by amplifying the input voltage. The voltage detection unit 11 configured as described above outputs the output signal of the digital filter 17 to the control unit 8 as a detection signal representing the detection result of the voltage of the battery cell Cb.

The control unit 8 is configured as, for example, a logic circuit, and its functional blocks include a detection control unit 21, an equalization control unit 22, a failure diagnosis unit 23, a communication control unit 24, a range specifying unit 25, and a characteristic setting unit 26, and the like. The control unit 8 communicates with the ECU 3, and executes various controls according to commands given from the ECU 3 through the communication. The ECU 3 is provided with a microcomputer 27, and the microcomputer 27 generates commands for instructing various control contents by the control unit 8. In this specification, a microcomputer may be abbreviated as a microcomputer.

The detection control unit 21 controls the operation of the voltage detection unit 10 and detects the voltage of the battery cell Cb based on the detection signal output from the digital filter 14 of the voltage detection unit 10. The result of such voltage detection is used for SOC estimation and the like. The detection control unit 21 stores data representing the result of voltage detection in the register 28. At this time, the data is stored in such a way that it can be identified in what detection range the detection result is obtained, in other words, with what detection accuracy the detection result is obtained.

As a specific method of storing such data, there is a method of adding a flag indicating the detection range, the detection accuracy, and the like to the data representing the detection result, and a method of dividing the storage location of data representing the detection result for each different detection range or detection accuracy, for example. The equalization control unit 22 controls the operation of the equalization switch SW and executes the above-described battery equalization process. The failure diagnosis unit 23 controls the operation of the voltage detection unit 11 and detects the voltage of the battery cell Cb based on the detection signal output from the voltage detection unit 11.

Like the detection control unit 21, the failure diagnosis unit 23 stores data representing the result of voltage detection in the register 28. The failure diagnosis unit 23 diagnoses failures in various paths and configurations related to voltage detection based on the result of voltage detection by itself and the result of voltage detection by the detection control unit 21. The communication control unit 24 controls communication with a microcomputer 27 included in the ECU 3 via a communication interface (not shown).

The range specifying unit 25 operates in response to a range specifying command given from the ECU 3, and specifies a detection range, which is a range for detecting the voltage of the battery cell Cb, to each of the voltage detection units 10 and 11. In other words, the range specifying unit 25 specifies the detection range of the voltage detecting units 10 and 11 based on the command given from the ECU 3. The range specifying unit 25 outputs a signal for specifying a detection range to the voltage detection units 10 and 11.

The characteristic setting unit 26 operates in response to a characteristic setting command given from the ECU 3 via communication, and sets the characteristics of the digital filters 14 and 17. That is, the characteristic setting unit 26 sets the characteristics of the digital filters 14 and 17 based on commands given from the ECU 3. The characteristic setting unit 26 outputs signals for setting the characteristics of digital filters 14 and 17 to the voltage detection units 10 and 11.

In the above configuration, the SC amplifier circuits 12 and 15 each have a sampling capacitor and a feedback capacitor. The sampling capacitor samples the voltage of the battery cell Cb, and the sampled charge is transferred via the feedback capacitor to output the voltage corresponding to the voltage of the battery cell Cb. The circuits 12 and 15 have a configuration in which the amplification factor and the offset can be switched. The voltage detection units 10 and 11 detect the voltage of the battery cell Cb within the detection range specified by the range specifying unit 25 by switching one or both of the amplification factor and the offset of the SC amplifier circuits 12 and 15. In other words, the voltage detection units 10 and 11 are configured to switch the detection range by switching one or both of the amplification factor and the offset of the SC amplifier circuits 12 and 15.

<Specific Circuit Configuration of SC Amplifier Circuit>

Figure 14:
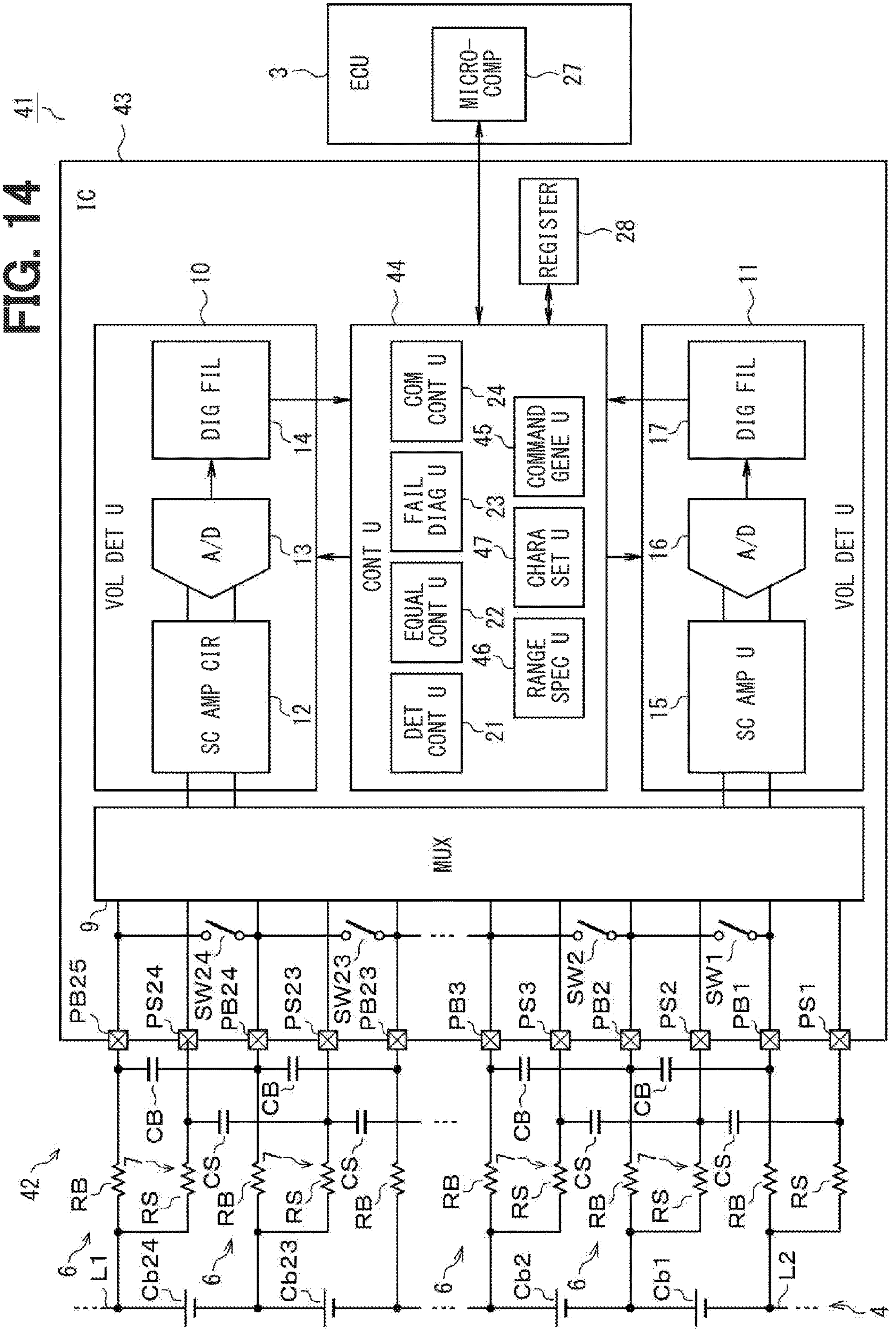
FIG. 14 is a diagram schematically showing the configuration of a battery monitoring system according to a second embodiment.

Specific configurations of the SC amplifier circuit 12 include the configuration of the SC amplifier circuit shown in FIG. 1 of JP-A-2019-32175, the configuration of the SC amplifier shown in FIG. 14 of JP-A-2019-32175, or the like. Here, JP-A-2019-32175 is incorporated herein by reference. Hereinafter, the former of these configurations will be described as a first configuration example, and the latter as a second configuration example. Although the configuration of the SC amplifier circuit 12 is illustrated here, the SC amplifier circuit 15 can also adopt a similar configuration.

[1] First Configuration Example of SC Amplifier Circuit

Figure 2:
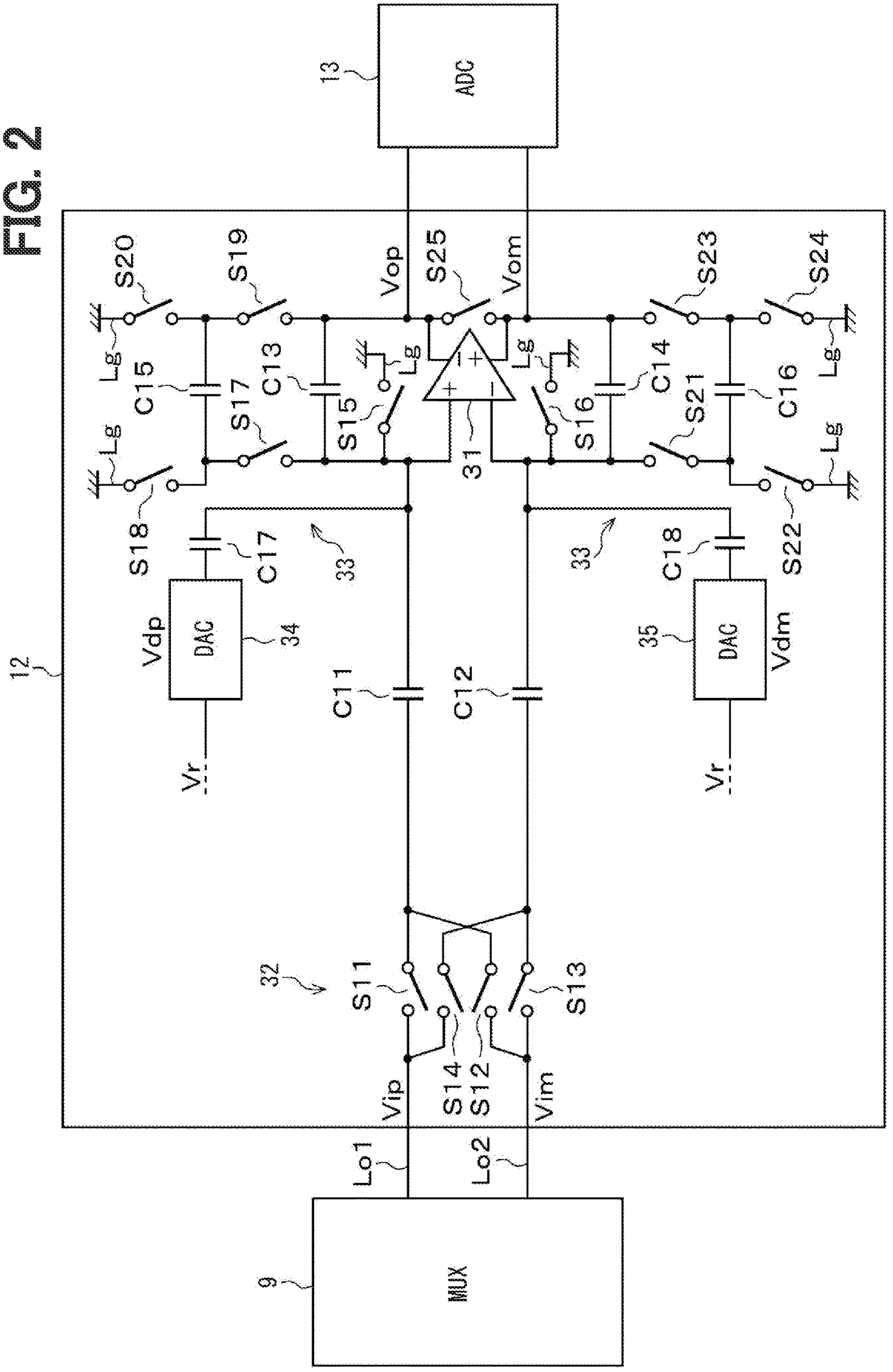
FIG. 2 is a diagram showing a specific first configuration example of the switched capacitor amplifier circuit according to the first embodiment.

As shown in FIG. 2, the SC amplifier circuit 12 of the first configuration example includes a differential output type OP amplifier 31, capacitors C11 to C18, and switches S11 to S25. A voltage output from the MUX 9 via the first output line Lo1 and a voltage output via the second output line Lo2 are input to the SC amplifier circuit 12. These two voltages are hereinafter referred to as input voltages Vip and Vim.

The SC amplifier circuit 12 samples the input voltages Vip and Vim using the capacitors C11 and C12 functioning as sampling capacitors, and transfers the sampled charges via the capacitors C13 to C16 functioning as feedback capacitors. Thus, the circuit 12 is a sample hold circuit with a differential configuration that outputs detection voltages corresponding to the voltages Vip and Vim. Here, the SC amplifier circuit 12 also performs a level shift to step down a high common mode voltage to a low common mode reference voltage Vcm.

The common voltage of the operational amplifier 31 is set equal to the reference voltage Vcm which is the reference for voltage detection. The reference voltage Vcm is an intermediate voltage between the power supply voltages of the circuits provided in the battery monitoring IC 5. In this embodiment, the power supply voltage is, for example, +5V, and the intermediate voltage is, for example, +2.5V. The OP amplifier 31 outputs output voltages Vop and Vom from its inverting output terminal and non-inverting output terminal, respectively. A switch S25 is connected between the inverting output terminal and the non-inverting output terminal of the OP amplifier 31.

The output voltages Vop and Vom correspond to detected voltages with respect to the input voltages Vip and Vim, that are, voltages corresponding to the voltages of the battery cells Cb, and are converted into digital data by the differential input type ADC 13 at the subsequent stage. The SC amplifier circuit 12 has a configuration capable of providing an offset so that the output voltages Vop and Vom are disposed within the input voltage range of the ADC 13. In this embodiment, the input voltage range of ADC 13 is, for example, +2.5V to −2.5V.

The paired capacitors C11 and C12 in the differential configuration have the same capacitance value Cs. The "same capacitance value" in the present application does not only refer to a situation where the capacitance values are exactly identical, but also refers to a situation where there is a slight difference in the capacitance values as long as an advantageous effect is attained. One terminal of the capacitor C11 is connected to the first output line Lo1 via the switch S11 and is connected to the second output line Lo2 via the switch S12. One terminal of the capacitor C12 is connected to the second output line Lo2 via the switch S13 and is connected to the first output line Lo1 via the switch S14.

In this case, the switches S11 to S14 constitute a transfer number switching unit 32 for switching the number of times the charge is transferred. The amplification factor of the SC amplifier circuit 12 changes according to the number of charge transfer times. Therefore, in the present embodiment, the SC amplifier circuit 12 is configured to switch the amplification factor by switching the number of transfer times by the transfer number switching unit 32. That is, in this case, it can be said that the voltage detection unit 10 is configured to switch the amplification factor of the SC amplifier circuit 12 by switching the number of transfer times by the transfer number switching unit 32.

The other terminal of the capacitor C11 is connected to the non-inverting input terminal of the OP amplifier 31 and to the ground line Lg to which the reference potential of the circuit is applied via the switch S15. The other terminal of the capacitor C12 is connected to the inverting input terminal of the OP amplifier 31 and to the ground line Lg via the switch S16. The paired capacitors C13 and C14 in the differential configuration have the same capacitance value Cf. The paired capacitors C15 and C16 in the differential configuration have the same capacitance value Cf2.

The capacitor C13 is connected between the non-inverting input terminal and the inverting output terminal of the OP amplifier 31. The capacitor C14 is connected between the inverting input terminal and the non-inverting output terminal of the OP amplifier 31. One terminal of the capacitor C15 is connected to the non-inverting input terminal of the OP amplifier 31 via the switch S17 and to the ground line Lg via the switch S18. The other terminal of the capacitor C15 is connected to the inverting output terminal of the OP amplifier 31 through the switch S19 and to the ground line Lg through the switch S20.

One terminal of the capacitor C16 is connected to the inverting input terminal of the OP amplifier 31 via the switch S21 and to the ground line Lg via the switch S22. The other terminal of the capacitor C16 is connected to the non-inverting output terminal of the OP amplifier 31 through the switch S23 and to the ground line Lg through the switch S24. According to such a configuration, when the switches S17, S19, S21, and S23 are off, the capacitor C13 is connected between the non-inverting input terminal and the inverting output terminal of the OP amplifier 31, and the capacitor C14 is connected between the inverting input terminal and the non-inverted output terminal of the OP amplifier 31. In this case, the capacitance value of the feedback capacitance is "Cf" which is the capacitance value of the capacitors C13 and C14.

However, when the switches S17, S19, S21, and S23 are on, the capacitors C13 and C15 are connected in parallel between the non-inverting input terminal and the inverting output terminal of the OP amplifier 31, and the capacitors C14 and C16 are connected in parallel between the inverting input terminal and the non-inverted output terminal of the OP amplifier 31. In this case, the capacitance value of the feedback capacitor is "Cf+Cf2" which is the sum of the capacitance value Cf of the capacitors C13 and C14 and the capacitance value Cf2 of the capacitors C15 and C16.

Thus, in the present embodiment, the capacitance value switching unit 33 that switches the capacitance value of the feedback capacitance is configured by the switches S17, S19, S21, and S23. In this case, the capacitance value switching unit 33 increases the capacitance value of the feedback capacitance by switching the switches S17, S19, S21, and S23 from off to on. The amplification factor of the SC amplifier circuit 12 changes according to the capacitance value of the feedback capacitance. Therefore, in the present embodiment, the SC amplifier circuit 12 is configured to switch the capacitance value by switching the capacitance value bu the capacitance value switching unit 33. That is, in this case, it can be said that the voltage detection unit 10 is configured to switch the amplification factor of the SC amplifier circuit 12 by switching the capacitance value using the capacitance value switching unit 33.

The capacitors C17 and C18 and the switches S25 to S30, which form a pair in the differential configuration, are a configuration for providing the aforementioned offset. One terminal of the capacitor C17 is connected to one terminal of the capacitor C15 and to the non-inverting input terminal of the OP amplifier 31. A D/A converter 34 is connected to the other terminal of the capacitor C17. In the present disclosure, the digital-to-analog converter may also be referred to as a DAC. One terminal of the capacitor C18 is connected to one terminal of the capacitor C16 and to the inverting input terminal of the OP amplifier 31. A DAC 35 is connected to the other terminal of the capacitor C18.

The DACs 34 and 35 are capacitive type or resistive type DACs that divide the input reference voltage Vr and output them, and their internal outputs are the voltage Vdp and the voltage Vdm. Thus, in the above configuration, the DACs 34 and 35 switch the offset of the SC amplifier circuit 12, that is, change the offset values Vdp and Vdm.

In the above configuration, the amplification factor of the SC amplifier circuit 12 can be set to an arbitrary value by a combination of the capacitance values Cs, Cf, Cf2 and Cr of the capacitors C11 to C18, that is, by the capacitance ratio. In this embodiment, the capacitance values of the capacitors C11 to C18 are set so that the capacitance ratio of the capacitance values Cs, Cf, Cf2, and Cr, for example, is the ratio shown in the following equation (1).

$$Cf:Cf2:Cs:Cr=1:1:2:1 \tag{1}$$

Further, the SC amplifier circuit 12 of the first configuration example described above can perform sampling twice for each voltage detection. In this case, in one of the two samplings, the input voltage Vip is sampled using the capacitor C11 and the input voltage Vim is sampled using the capacitor C12. In the other of the two samplings, the input voltage Vip is sampled using the capacitor C12 and the input voltage Vim is sampled using the capacitor C11. According to such an input inversion double sampling detection method, it is possible to obtain the effect of reducing the detection error caused by the offset of the OP amplifier 31.

When the SC amplifier circuit 12 of the first configuration example is arranged, the operation of the voltage detection unit 10 is performed in the order of the first sampling, the first charge transfer, the second sampling and the second charge transfer. Then, the control unit 8 executes digital processing using digital data obtained by A/D converting the output voltages Vop and Vom output from the voltage detection unit 10, whereby the voltage of the battery cell Cb is detected.

During the period in which the first sampling is performed, the ON/OFF states of the switches S11 to S30 are as follows.

The switch S11 is in an on state, the switch S12 is in an off state, the switch S13 is in an on state, the switch S14 is in an off state, the switch S15 is in an on state, and the switch S16 is in an on state, the switch S17 is in an off state, the switch S18 is in an on state, the switch S19 is in an off state, the switch S20 is in an on state, the switch S21 is in an off state, the switch S22 is in an on state, the switch S23 is in an off state, the switch S24 is in an on state, and the switch S25 is in an on state.

As a result, the capacitor C11 is charged with the input voltage Vip and the capacitor C12 is charged with the input voltage Vim. That is, the input voltage Vip is sampled by the capacitor C11, and the input voltage Vim is sampled by the capacitor C12. Further, the accumulated charges of the capacitors C13 to C16 are all discharged by short-circuiting the terminals thereof. Furthermore, the capacitors C17 and C18 are charged by the reference voltage Vcm.

During the period in which the first charge transfer is performed, the ON/OFF states of the switches S11 to S30 are as follows.

The switch S11 is in an off state, the switch S12 is in an on state, the switch S13 is in an off state, the switch S14 is in an on state, the switch S15 is in an off state, and the switch S16 is in an off state, the switch S17 is in an off state, the switch S18 is in an on state, the switch S19 is in an off state, the switch S20 is in an on state, the switch S21 is in an off state, the switch S22 is in an on state, the switch S23 is in an off state, the switch S24 is in an on state, and the switch S25 is in an off state.

Thereby, the charge accumulated in the capacitor C11 is transferred via the capacitor C13. Also, the charge accumulated in the capacitor C12 is transferred via the capacitor C14. By such first charge transfer, the voltage Vo[1], which is the differential voltage between the output voltages Vop and Vom output from the SC amplifier circuit 12, is represented by the following equation (2). Here, "Vip−Vim", which is the difference voltage between the input voltages Vip and Vim, is defined as Vin, and "Vdp−Vdm", which is the difference voltage between the voltage Vdp of the DAC 34 and the voltage Vdm of the DAC 35, is defined as Vd. The voltage Vd is adjusted to allow for arbitrary offset changes.

$$Vo[1]=(2\cdot Cs\cdot Vin-Cr\cdot Vd)/Cf \tag{2}$$

Considering the capacitance ratio of the capacitors C11 to C18 shown in the equation (1), the following equation (3) can be derived from the equation (2).

$$Vo[1]=4\cdot Vin-Vd \tag{3}$$

As shown in the above equation (3), in this case, a voltage four times the input voltage is obtained as the voltage Vo[1]. Therefore, the amplification factor for one sampling, that is, the first sampling and the first charge transfer is "4".

The ADC 13 inputs the output voltages Vop and Vom obtained by the first charge transfer, performs A/D conversion, and outputs digital data corresponding to the voltage Vo[1], which is the difference between them, to the control unit 8.

During the period in which the second sampling is performed, the ON/OFF states of the switches S11 to S30 are as follows.

The switch S11 is in an off state, the switch S12 is in an on state, the switch S13 is in an off state, the switch S14 is in an on state, the switch S15 is in an on state, and the switch S16 is in an on state, the switch S17 is in an off state, the switch S18 is in an on state, the switch S19 is in an off state, the switch S20 is in an on state, the switch S21 is in an off state, the switch S22 is in an on state, the switch S23 is in an off state, the switch S24 is in an on state, and the switch S25 is in an on state.

As a result, the capacitor C11 is charged with the input voltage Vim and the capacitor C12 is charged with the input voltage Vip. That is, the input voltage Vim is sampled by the capacitor C11, and the input voltage Vip is sampled by the capacitor C12. Thus, in the second sampling, the input to the SC amplifier circuit 12 is inverted with respect to the first sampling. Further, the accumulated charges of the capacitors C13 to C16 are all discharged by short-circuiting the terminals thereof. Furthermore, the capacitors C17 and C18 are charged by the reference voltage Vcm.

During the period in which the second charge transfer is performed, the ON/OFF states of the switches S11 to S30 are as follows.

The switch S11 is in an on state, the switch S12 is in an off state, the switch S13 is in an on state, the switch S14 is in an off state, the switch S15 is in an off state, and the switch S16 is in an off state, the switch S17 is in an off state, the switch S18 is in an on state, the switch S19 is in an off state, the switch S20 is in an on state, the switch S21 is in an off state, the switch S22 is in an on state, the switch S23 is in an off state, the switch S24 is in an on state, and the switch S25 is in an off state.

Thereby, the charge accumulated in the capacitor C11 is transferred via the capacitor C13. Also, the charge accumulated in the capacitor C12 is transferred via the capacitor C14. By such second charge transfer, the voltage Vo[2], which is the differential voltage between the output voltages Vop and Vom output from the SC amplifier circuit 12, is represented by the following equation (4).

$$Vo[2]=-(2\cdot Cs\cdot Vin-Cr\cdot Vd)/Cf \tag{4}$$

Considering the capacitance ratio of the capacitors C11 to C18 shown in the equation (1), the following equation (5) can be derived from the equation (4).

$$Vo[2]=-4\cdot Vin-Vd \tag{5}$$

As shown in the above equation (5), in this case, a voltage four times the input voltage is obtained as the voltage Vo[2]. Therefore, the amplification factor for one sampling, that is, the second sampling and the second charge transfer is "4".

The ADC 13 inputs the output voltages Vop and Vom obtained by the second charge transfer, performs A/D conversion, and outputs digital data corresponding to the voltage Vo[2], which is the difference between them, to the control unit 8.

The control unit 8 uses the digital data corresponding to each of the voltage Vo[1] and the voltage Vo[2] to perform processing, i.e., calculation, to obtain the detection value Vad of the voltage of the battery cell Cb. The detection value Vad obtained by such processing is represented by the following equation (6).

$$Vad=(Vo[1]-Vo[2])=8\cdot Vin \tag{6}$$

As shown in the above equation (6), in this case, the voltage eight times higher than the input voltage is obtained as the detection value Vad of the voltage of the battery cell Cb. That is, the overall amplification factor in this case is "8".

[2] Second Configuration Example of SC Amplifier Circuit

Figure 3:
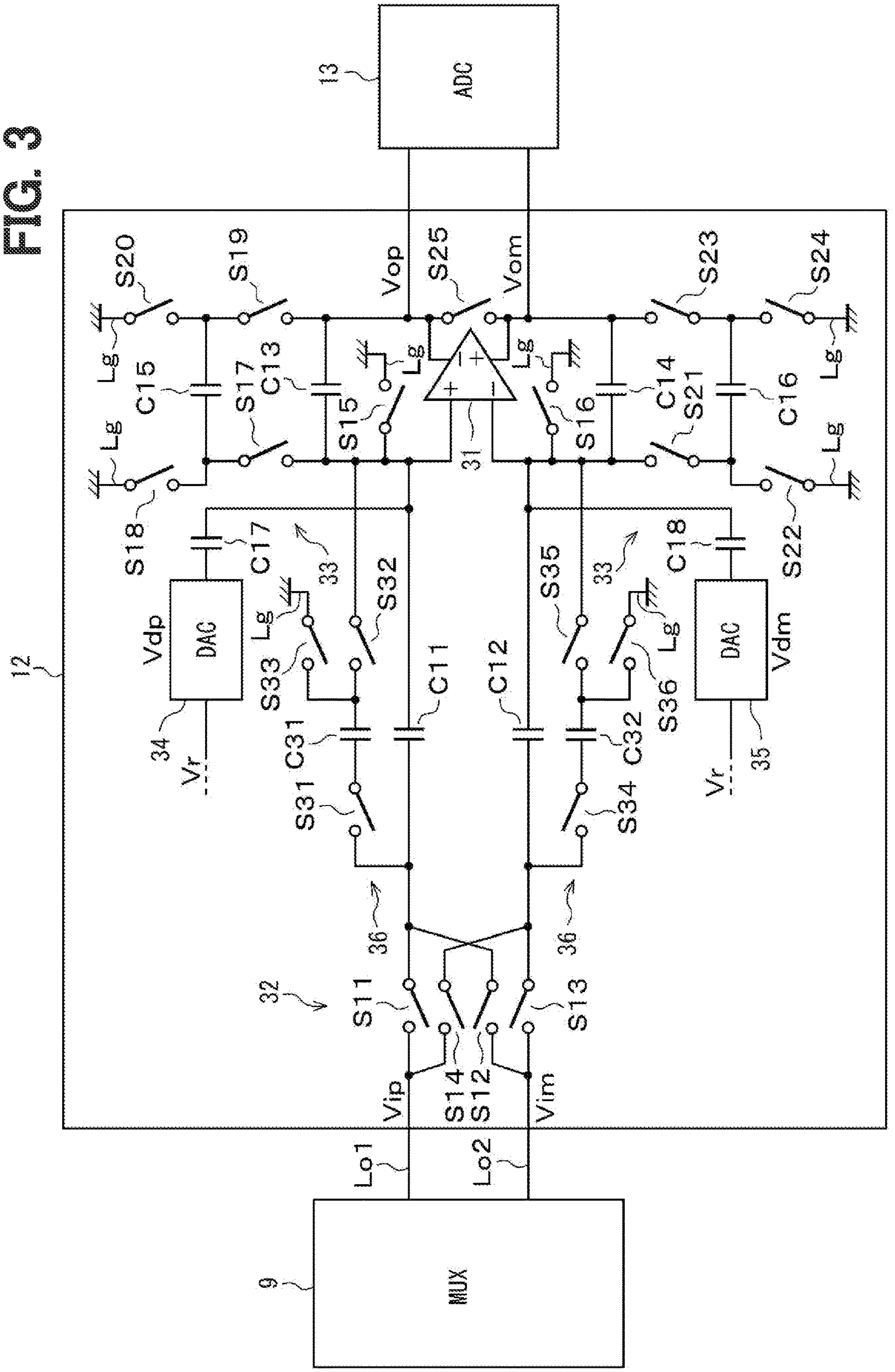
FIG. 3 is a diagram showing a specific second configuration example of the switched capacitor amplifier circuit according to the first embodiment.

As shown in FIG. 3, the SC amplifier circuit 12 of the second configuration example differs from the SC amplifier circuit 12 of the first configuration example shown in FIG. 2 in that capacitors C31 and C32 and switches S31 to S36 are added. The capacitors C31 and C32 form a pair in a differential configuration and have the same capacitance value Csi. One terminal of the capacitor C31 is connected to one terminal of the capacitor C11 via the switch S31, and the other terminal is connected to the other terminal of the capacitor C11 via the switch S32. The other terminal of the capacitor C31 is connected to the ground line Lg through the switch S33.

One terminal of capacitor C32 is connected to one terminal of capacitor C12 via switch S34, and the other terminal is connected to the other terminal of capacitor C12 via switch S35. The other terminal of the capacitor C32 is connected to the ground line Lg through the switch S36. In the above configuration, the switches S33 and S36 are turned on and off in the same manner as the switches S15 and S16. On the other hand, the switches S31, S32, S34, and S35 are turned on and off according to switching of the capacitance values of the sampling capacitors, as will be described later.

In the SC amplifier circuit 12 of the second configuration example described above, the state where the capacitors C11 and C12 function as sampling capacitors and the state where the parallel combined capacitance of the capacitors C11 and C31 and the parallel combined capacitance of the capacitors C12 and C32 function as sampling capacitance are switched according to the on and off state of the switches S31, S32, S34, and S35. As described above, in the configuration example of the second configuration, the capacitance value switching unit 36 that switches the capacitance value of the sampling capacitor is configured by the switches S31, S32, S34, and S35. In this case, the capacitance switching unit 36 increases the sampling capacitance by switching the switches S31, S32, S34, and S35 from off to on.

The amplification factor of the SC amplifier circuit 12 varies depending not only on the capacitance value of the feedback capacitance but also on the capacitance value of the sampling capacitance. Therefore, in the present embodiment, the amplification factor of the SC amplifier circuit 12 is switched not only by switching the capacitance value using the capacitance value switching unit 33 but also by switching the capacitance value using the capacitance value switching unit 36. That is, the SC amplifier circuit 12 of the second configuration example includes capacitance value switching units 33 and 36 that switch both the capacitance value of the sampling capacitor and the capacitance value of the feedback capacitor, and the amplification factor is switched by switching the capacitance values using the capacitance value switching units 33 and 36.

<About Voltage Detection Error>

According to the voltage detection units 10 and 11 configured as described above, the detection range can be switched by switching the amplification factor of the SC amplifier circuits 12 and 15. The detection range of the voltage detection units 10 and 11 becomes a relatively wide detection range equivalent to that of the conventional battery monitoring device when the amplification factor of the SC amplifier circuits 12 and 15 is set to "1". When the amplification factor is set to be larger than "1", the detection range becomes a relatively narrow detection range which is limited from the detection range of the conventional battery monitoring device. Hereinafter, the operation with the amplification factor set to "1" will be referred to as normal operation, and the operation with the amplification factor set to "a value exceeding 1" will be referred to as zoom operation. Also, the detection range in the normal operation will be referred to as a wide range, and the detection range in the zoom operation will be referred to as a narrow range.

A voltage detection value Vad in the normal operation is expressed by the following equation (7). However, the error of the reference voltage Vr of the DACs 34 and 35 is defined as ΔVr, and the quantization error, which is the error of the ADC, is defined as Vq. Further, the voltage detection value Vad/Gaind when detecting a voltage value near "Vr/2" by subtracting the offset Vr/2 in the zoom operation is expressed by the following equation (8). Here, the amplification factor in the analog circuit is Gaina, and the amplification factor in the digital circuit is Gaind.

$$Vad = \frac{Vr}{2}\left(\frac{Vin - \left(\frac{Vr + \Delta Vr}{2}\right)}{\left(\frac{Vr + \Delta Vr}{2}\right)} + 1\right) + Vq = \frac{Vin \times Vr}{Vr + \Delta Vr} + Vq \tag{7}$$

$$\frac{Vad}{Gaind} = \frac{Vr}{2Gaind}\left(\frac{Gaina\left(Vin - \left(\frac{Vr + \Delta Vr}{2}\right)\right)}{\left(\frac{Vr + \Delta Vr}{2}\right)} + Gaina\right) + \frac{Vq}{Gaind} = \frac{Gaina(Vin \times Vr)}{Gaind(Vr + \Delta Vr)} + \frac{Vq}{Gaind} \tag{8}$$

As shown in the above equations (7) and (8), the voltage detection error includes an error due to the quantization error Vq and an error due to the error ΔVr of the reference voltage Vr. Among these errors, the error due to the error ΔVr of the reference voltage Vr has a constant value regardless of the amplification factor, so there is no large difference between the normal operation and the zoom operation. However, the error due to the quantization error Vq approaches zero as the amplification factor Gaind increases in the zoom operation. Therefore, in the zoom operation, the error caused by the quantization error Vq can be reduced as the amplification factor is increased to narrow the detection range, and as a result, high accuracy can be achieved. In this way, according to the zoom operation, it is possible to reduce temperature characteristics and endurance fluctuations regarding ADC errors such as linear error, thermal noise, and flicker, and the error ΔVr of the reference voltage Vr, thereby realizing high accuracy.

In the case of the zoom operation, a gain error called "Gaina/Gaind" is included. This gain error can be zero if Gaina and Gaind have the same value, so the circuit is designed so that they have the same value, but actually it is difficult to match them perfectly. Therefore, in the present embodiment, correction is performed so that the term "Gaina/Gaind" becomes "1", thereby making the gain error zero.

Figure 4:
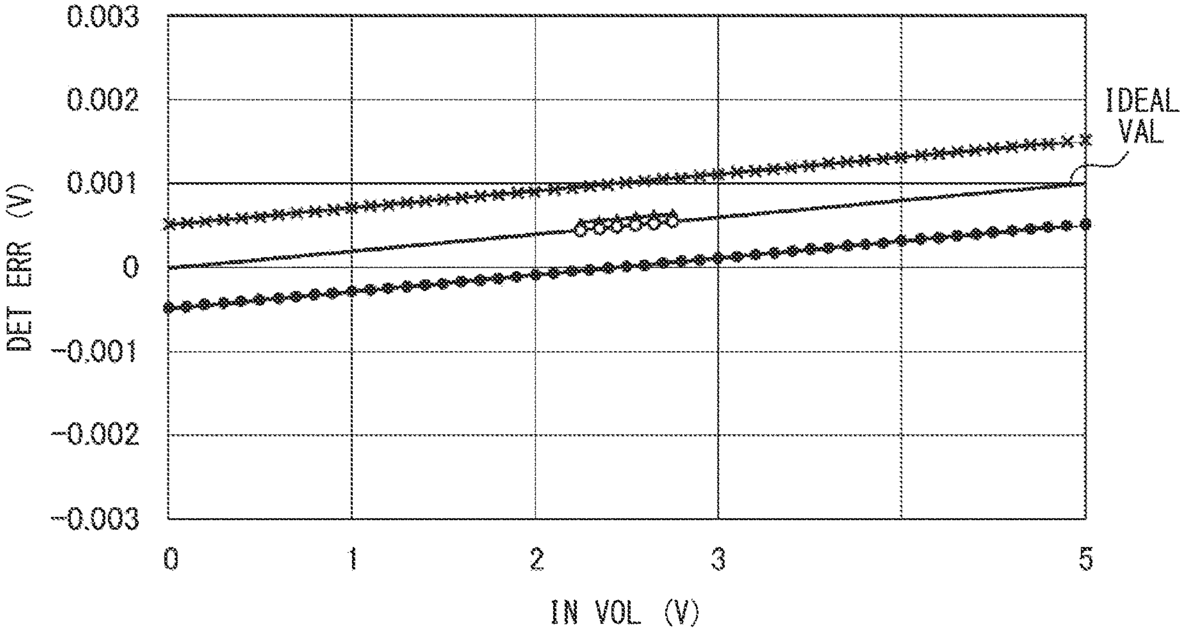
FIG. 4 is a diagram for explaining voltage detection accuracy according to the first embodiment, and showing an example of the relationship between an input voltage and a detection error.
Figure 5:
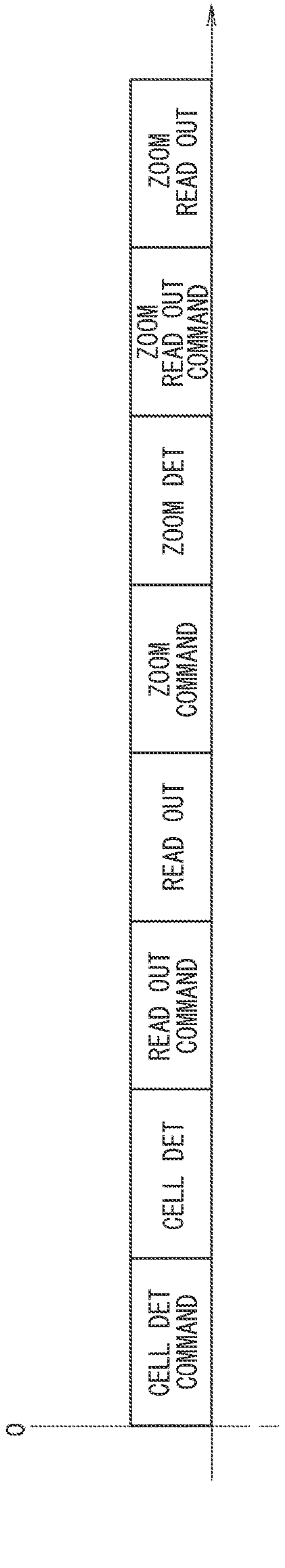
FIG. 5 is a diagram showing an example of the operation flow of the battery monitoring device according to the first embodiment.

FIG. 4 shows an example of the relationship between the input voltage Vin and the detection error when the error ΔVr of the reference voltage Vr is 1 mV, the ADC error is 0.5 mV, and the amplification factor is "8". In this case, the detection range in the normal operation is 0V to 5V, and the detection range in the zoom operation is 2.25V to 2.75V. In FIG. 4, minus errors in the normal operation are marked with black circles •, plus errors in the normal operation are marked with crosses X, and minus errors in the zoom operation are marked with white circles ○, and plus errors in the zoom operation is marked with a black triangle ▲.

As shown in FIG. 4, in the normal operation, there is a relatively large detection error of about ±0.5 mV with respect to the ideal value at which the detection error is zero. On the other hand, in the zoom operation, the detection error with respect to the ideal value is a much smaller value than in the normal operation. In this way, the voltage detection accuracy in the zoom operation is greatly improved compared to the voltage detection accuracy in the normal operation. Also, as described above, the voltage detection accuracy in the zoom operation increases as the amplification factor increases. Therefore, in the configuration of this embodiment, the wider the detection range of the voltage detection units 10 and 11, the lower the voltage detection accuracy. Further, the narrower the detection range, the higher the detection accuracy.

<Flow of Operations by the Battery Monitoring Device>

The battery monitoring device 2 configured as described above performs various operations based on commands given from the ECU 3. An example of such an operation flow will be described below with reference to FIG. 5. First, the ECU 3 transmits a "cell detection command". The "cell detection command" is a command for commanding voltage detection in the normal operation, and includes a range designation command for designating a wide detection range and a characteristic setting command for setting the characteristics of the digital filters 14 and 17 to predetermined characteristics. Here, the characteristic setting command may not be included in the "cell detection command", and may be transmitted in advance as a separate command from the "cell detection command".

When the battery monitoring device 2 receives the "cell detection command", it executes "cell detection". In "cell detection", the detection range and the characteristics of the digital filters 14 and 17 are set based on the "cell detection command", and the operation for detecting the voltage of the battery cell Cb is performed. Subsequently, the ECU 3 transmits a "read out command". A "read out command" is a command to read the result of voltage detection over a wide range. When receiving the "read out command", the battery monitoring device 2 executes the "read out". In the "read out", data indicating the result of voltage detection in a wide range is read from the register 28 and an operation for transmitting the data to the ECU 3 is performed.

After that, the ECU 3 transmits a "zoom command". The "zoom command" is a command for commanding voltage detection in the zoom operation, and includes a range designation command for designating a narrow detection range and a characteristic setting command for setting the characteristics of the digital filters 14 and 17 to predetermined characteristics. Here, the characteristic setting command may not be included in the "zoom command", and may be transmitted in advance as a separate command from the "zoom command".

When the battery monitoring device 2 receives the "zoom command", it executes "zoom detection". In the "zoom detection", the detection range and the characteristics of the digital filters 14 and 17 are set based on the "zoom command", and the operation for detecting the voltage of the battery cell Cb is performed. Subsequently, the ECU 3 transmits a "zoom read out command". The "zoom read out command" is a command to read the result of voltage detection over a narrow range. When receiving the "zoom read out command", the battery monitoring device 2 executes "zoom read out". In the "zoom read out", data indicating the result of voltage detection in a narrow range is read from the register 28 and an operation for transmitting the data to the ECU 3 is performed.

<Specific Example of Switching Detection Range>

As described above, the battery monitoring device 2 of the present embodiment can switch the detection range, which is the range for detecting the voltage of the battery cell Cb, and thus the detection accuracy of the voltage of the battery cell Cb. The switching thereof may be performed based on various ideas. A plurality of specific examples of such switching will be described below.

[1] First Specific Example

In the first specific example, the battery monitoring device 2 individually designates the detection range in the zoom operation for each battery cell Cb. In other words, in this case, the range specifying unit 25 is configured to be able to specify the detection range independently for each battery cell Cb. In this case, first, the voltage level of each battery cell Cb is searched. Such a search can be performed, for example, by performing voltage detection in the normal operation.

Figures 6, 7:
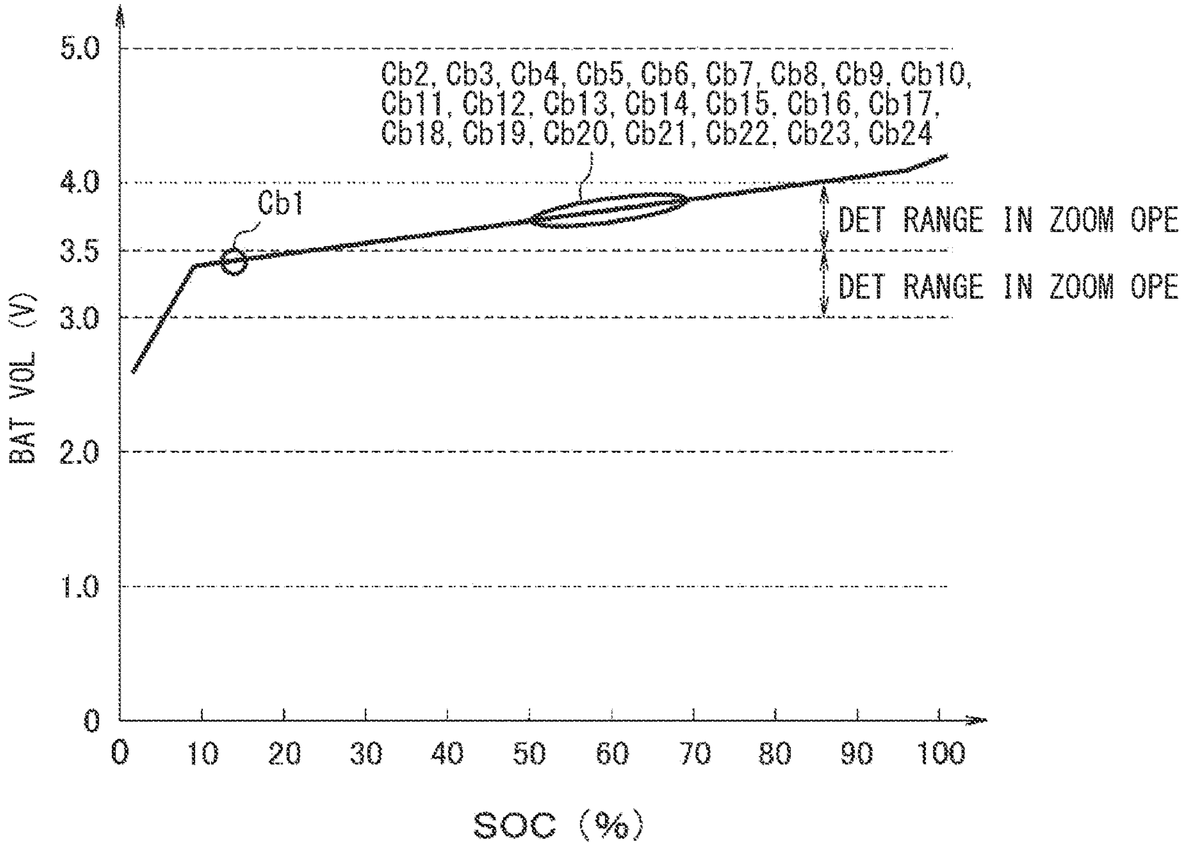
FIG. 6 is a diagram showing a detection range in ZOOM operation of each battery cell Cb according to a first specific example of the first embodiment.
FIG. 7 is a diagram for explaining the detection range in the ZOOM operation of each battery cell Cb according to the first specific example of the first embodiment, and showing an example of the relationship between the battery voltage and the SOC.

Based on the results of such search, the detection range in the zoom operation of each battery cell Cb is specified individually. In this case, as shown in FIG. 6, the detection range in the zoom operation is divided into multiple ranges between 0 V and 0.5 V at every 0.5 V such as a range between 0 V and 0.5 V, a range between 0.5 V and 1.0 V, . . . , a range between 4.0 V and 4.5 V, and a range between 4.5 V and 5.0 V. Such detection range selection can be implemented by switching the offsets of the SC amplifier circuits 12 and 15.

As a result of the above search, as shown in FIG. 7, for example, the voltage value of the battery cell Cb1 is in the range of 3.0 V to 3.5V, and the voltage values of the battery cells Cb2 to Cb24 are in the range of 3.5 V to 4.0V. In this case, as shown in FIGS. 6 and 7, the detection range in the zoom operation of the battery cell Cb1 is set to a range of 3.0 V to 3.5 V, and the detection range in the zoom operation of the battery cells Cb2 to Cb24 is set to a range of 3.5 V to 4.0V. After that, voltage detection is performed in the zoom operation based on the detection range set in this way.

[2] Second Specific Example

In the second specific example, the battery monitoring device 2 designates the detection range based on the cell voltage range predetermined for each type of battery cell Cb. That is, in this case, the range specifying unit 25 specifies the detection range based on the cell voltage range. The detection range can be specified in consideration of the following points. That is, in the battery monitoring device 2, it is necessary to improve the accuracy of SOC estimation in a region where the SOC is close to 0% and a region where the SOC is close to 100%. This is because if the SOC estimation accuracy decreases in these regions, over-discharging or over-charging may occur.

Figure 8:
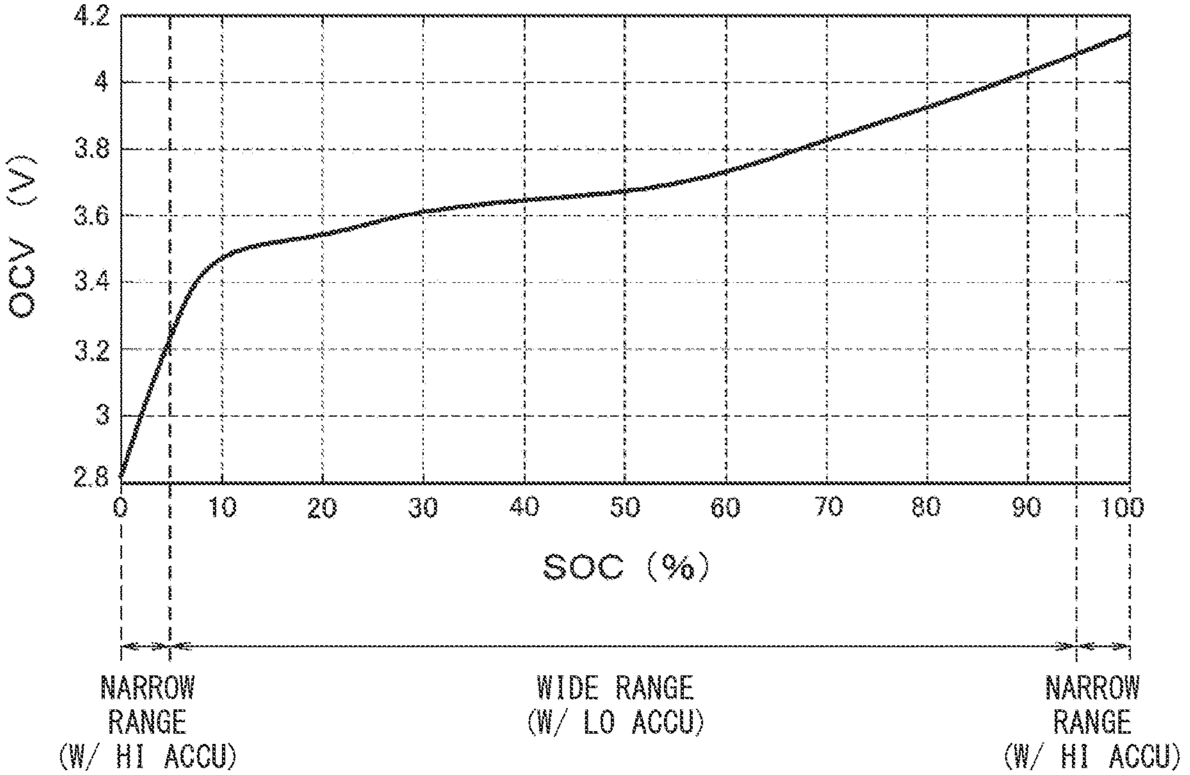
FIG. 8 is a diagram for explaining a method of specifying a detection range according to a second specific example of the first embodiment, and showing an example of the relationship between OCV and SOC.

On the other hand, in other areas, the SOC estimation accuracy does not require such accuracy. Therefore, in the second specific example, as shown in FIG. 8, a narrow range is specified as the detection range in the area where the SOC is close to 0% and the area where the SOC is close to 100%, and a wide range is specified as the detection range in other area. In this way, in the area where the SOC is close to 0% and the area where the SOC is close to 100%, the accuracy of voltage detection is relatively high accuracy, thereby preventing the occurrence of over discharge and over charge. In other area, the accuracy of voltage detection becomes coarse accuracy, which is relatively low accuracy, and the time required for voltage detection, and thus the time required for SOC estimation, is shortened.

[3] Third Specific Example

Figure 9:
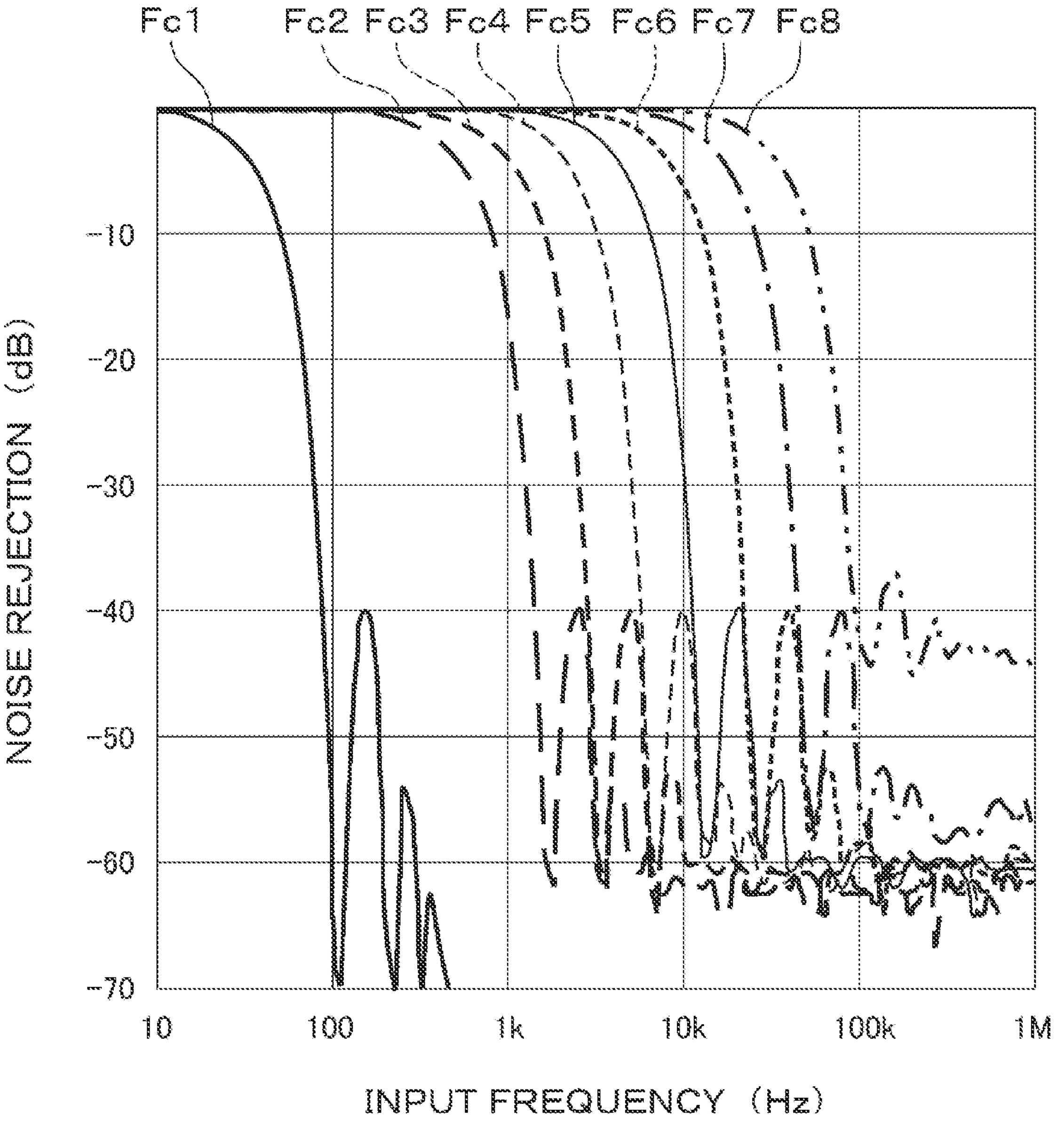
FIG. 9 is a diagram showing an example of noise removal performance of a digital filter according to a third specific example of the first embodiment.

As shown in FIG. 9, the digital filters 14 and 17 have different noise removal performances depending on their cutoff frequencies Fc. In FIG. 9, the characteristic with a cutoff frequency of 26 Hz is defined as Fc1, the characteristic with a cutoff frequency of 422 Hz is defined as Fc2, the characteristic with a cutoff frequency of 1 kHz is defined as Fc3, the characteristic with a cutoff frequency of 2 kHz is defined as Fc4, the characteristic with a cutoff frequency at 3 kHz is defined as Fc5, the characteristic at a cutoff frequency of 7 kHz is defined as Fc6, the characteristic with a cutoff frequency of 14 kHz is defined as Fc7, and the characteristic with a cutoff frequency of 27 kHz is defined as Fc8.

Figure 10:
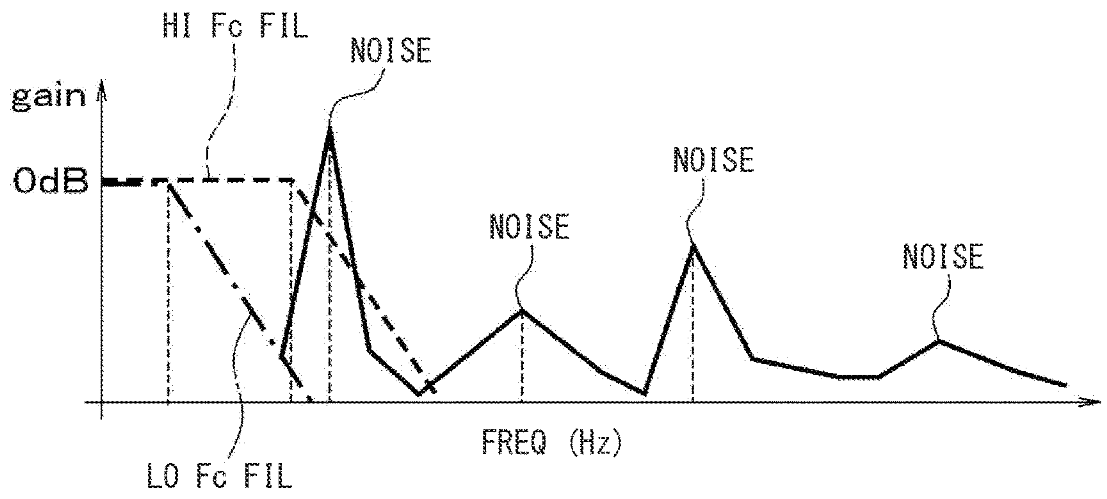
FIG. 10 is a diagram showing an example of various noises generated in a vehicle and noise removal performance of a high Fc filter and a low Fc filter according to a third specific example of the first embodiment.

In a vehicle, there are various types of ripple noise, noise generated by the operation of DC/DC converters, inverters, and the like, and various types of harmonic noise. As shown in FIG. 10, noise generated in a vehicle includes various frequency components. A high Fc filter, which is a filter with a relatively high cutoff frequency Fc, may not be able to completely remove noise with a lower frequency among these noises. On the other hand, a low Fc filter, which is a filter with a relatively low cutoff frequency Fc, can almost reliably remove even low-frequency noise.

That is, the lower the cutoff frequency Fc of the digital filters 14 and 17, that is, the heavier the filter, the more noise at a lower frequency can be removed, but the delay time in the filter increases accordingly. This means that the conversion time will be longer. On the other hand, the higher the cutoff frequency Fc of the digital filters 14 and 17, that is, the lighter the filter, the more difficult it is to remove noise of lower frequencies, but the shorter the delay time in the filter, that is, the conversion time is shortened.

Based on these points, in the third specific example, the battery monitoring device 2 sets the cutoff frequencies of the digital filters 14 and 17 relatively high when a relatively wide range is specified as the detection range. The battery monitoring device 2 sets the cutoff frequencies of the digital filters 14 and 17 relatively low when a relatively narrow range is specified as the detection range.

That is, in this case, when the range specifying unit 25 specifies a wide range as the detection range, the characteristic setting unit 26 sets the cutoff frequency, which is the characteristic of the digital filters 14 and 17, to a high frequency. That is, in this case, when the range specifying unit 25 specifies a narrow range as the detection range, the characteristic setting unit 26 sets the cutoff frequency, which is the characteristic of the digital filters 14 and 17, to a low frequency. In this way, the conversion time is shortened when voltage is detected in a wide range, so that the detection time can be further shortened, and the noise removal performance is improved when the voltage is detected in a narrow range, so that the detection accuracy is further increased.

[4] Fourth Specific Example

In the fourth specific example, the battery monitoring device 2 switches the detection range according to the type of battery cell Cb. That is, in this case, the range specifying unit specifies the detection range based on the type of battery cell Cb. The battery cell Cb has a different voltage range depending on the type, such as a lithium ion battery or a fuel cell battery. Therefore, in the fourth specific example, the battery monitoring device 2 switches the detection range so that the voltage can be detected in the entire voltage range of the battery cell Cb as a detection target. Such switching of the detection range can be performed as follows.

That is, the relationship between the input voltage Vin and the output voltage Vo of the SC amplifier circuits 12 and 15 is represented by the following equation (9).

$$Vo=(Cs\cdot V\mathrm{in})/Cf-(Cr\cdot Vr)/Cf \quad (9)$$

As shown in the above equation (9), in the above configuration, by changing the capacitance ratio, the value of the reference voltage Vr, and the like, in other words, by changing the amplification factor and the offset in the SC amplifier circuits 12 and 15, the detection range can be adjusted to a desired range, that is, the detection range can be switched to an appropriate range.

Figure 11:
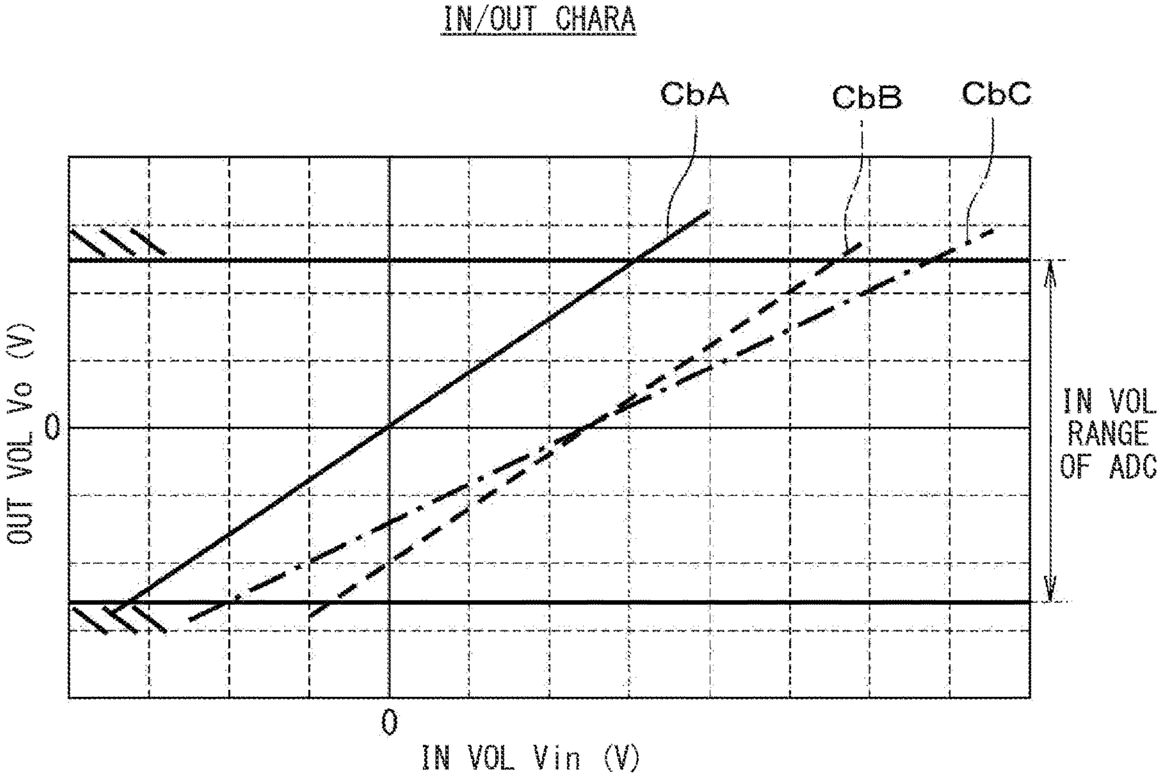
FIG. 11 is a diagram showing an example of input/output characteristics of three types of battery cells having different voltage ranges according to a fourth specific example of the first embodiment, and showing the relationship between input and output voltages of an SC amplifier circuit.

FIG. 11 shows input/output characteristics of three types of battery cells Cb having different voltage ranges. Here, in FIGS. 11, A, B, and C are added to the ends of the three battery cells Cb in order to distinguish them. As shown in FIG. 11, in this embodiment, the detection range is switched so that the output voltage Vo of the SC amplifier circuits 12 and 15 falls within the input voltage range of the ADCs 13 and 16 for each of these three types of battery cells Cb. As a result, voltage detection is possible over the entire voltage range for each of the three types of battery cells Cb.

[5] Fifth Specific Example

In the fifth specific example, the battery monitoring device 2 designates the detection ranges of the voltage detection units 10 and 11 to be the same range, and sets the characteristics of the digital filters 14 and 17 included in the voltage detection units 10 and 11 to be the same. That is, in this case, the range specifying unit 25 specifies each detection range so that the detection range of the voltage detection unit 10 and the detection range of the voltage detection unit 11 are the same range. Specifically, the range specifying unit 25 specifies a wide range or a narrow range as each detection range in the voltage detection units 10 and 11.

In this case, the characteristic setting unit 26 sets the characteristics so that the characteristics of the digital filter 14 included in the voltage detection unit 10 and the characteristics of the digital filter 17 included in the voltage detection unit 11 are the same. Specifically, the characteristic setting unit 26 sets a high frequency or a low frequency as the cutoff frequencies of the digital filters 14 and 17. In this specification and the like, "same timing" means not only that the timing is exactly the same, but also that the timing is slight different from each other so that the timing is not exactly the same as long as the intended effect is achieved. According to the fifth specific example, the detection timings of the voltage detectors 10 and 11 are as shown in FIG. 12, for example.

Figure 12:
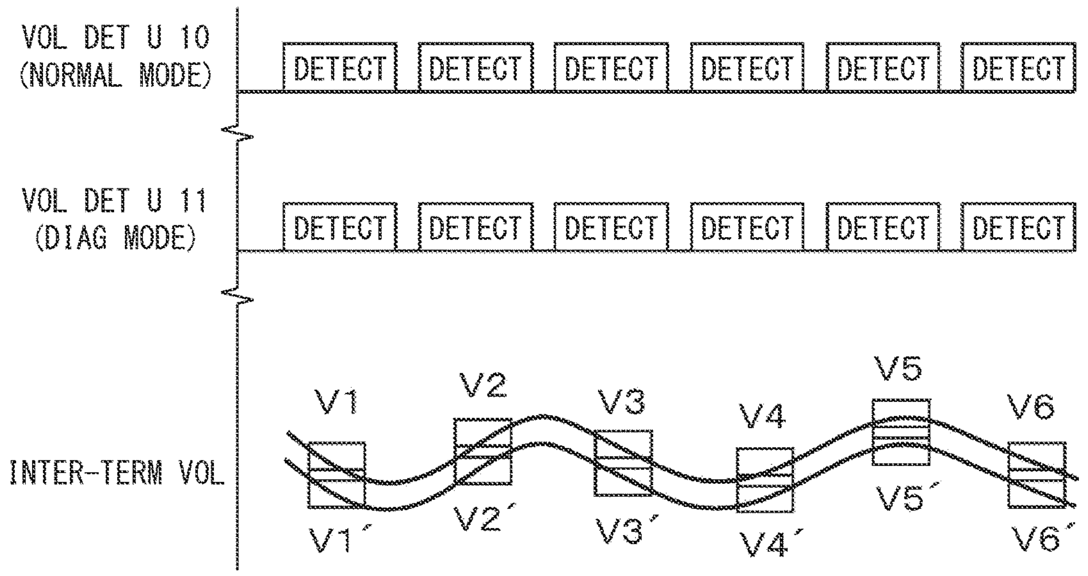
FIG. 12 is a diagram showing an example of detection timing of battery cell voltage by each voltage detection unit according to a fifth specific example of the first embodiment.

As shown in FIG. 12, in this case, while the voltage detection unit 10 detects the voltage of the battery cell Cb1, the voltage detection unit 11 also detects the voltage of the battery cell Cb1. After the detection of the battery cell Cb1, similarly to the battery cell Cb1, the voltage detection unit 10 and the voltage detection unit 11 detect the voltage of the same battery cell Cb in the same period. In this way, the detection timing of the voltage of each battery cell Cb by the voltage detection units 10 and 11 can be put on the same timing. This improves the matching of the acquisition timing between the timing of the voltage of each battery cell Cb using the voltage detection unit 10 and the timing of the voltage of each battery cell Cb using the voltage detection unit 11.

In this case, the matching between the time constant of the digital filter 14 of the voltage detection unit 10 and the time constant of the digital filter 17 of the voltage detection unit 11 is improved. Therefore, according to the fifth specific example, even when the voltage across the terminals of each battery cell Cb fluctuates greatly, the voltage detection value of a certain battery cell Cb by the voltage detection unit 10 and the voltage detection value of the certain battery cell Cb by the voltage detection unit 11 can be substantially matched. As a result, the accuracy of fault diagnosis is improved. In FIG. 12, the voltage detection values of the battery cells Cb1 to Cb6 by the voltage detection unit 10 are defined as V1 to V6, and the voltage detection values of the battery cells Cb1 to Cb6 by the voltage detection unit 11 are defined as V1' to V6'.

[6] Sixth Specific Example

In the sixth specific example, the battery monitoring device 2 designates a wide detection range of the voltage detection unit 10 so that the detection accuracy of the voltage by the voltage detection unit 10 is set to be coarse. And, the battery monitoring device 2 designates a narrow detection range of the voltage detection unit 11 so that the detection accuracy of the voltage by the voltage detection unit 11 is set to be high. That is, in this case, the range specifying unit 25 specifies a relatively wide range as the detection range of the voltage detection unit 10, and specifies a relatively narrow range as the detection range of the voltage detection unit 11.

Figure 13:
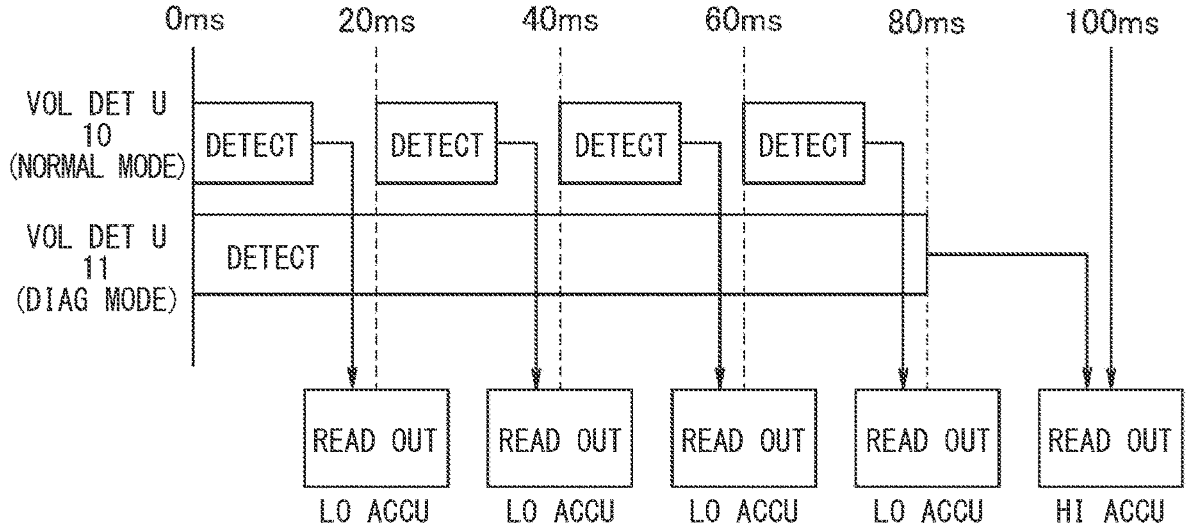
FIG. 13 is a diagram showing an example of detection timing of battery cell voltage by each voltage detection unit according to a sixth specific example of the first embodiment.

According to the sixth specific example, the detection timings of the voltage detectors 10 and 11 are as shown in FIG. 13, for example. As shown in FIG. 13, in this case, since the detection range is wide, the voltage detection unit 10 performs the voltage detection operation in a relatively short period, for example, every 20 ms. Therefore, the voltage detection value with the coarse accuracy detected by the voltage detection unit 10 is read out from the register 28 at relatively short intervals in the same manner as the detection. On the other hand, since the detection range of the voltage detection unit 11 is narrow, the voltage detection unit 11 performs the voltage detection operation in a cycle longer than that of the voltage detection unit 10, for example, every 100 ms. Therefore, the voltage detection value with the high accuracy detected by the voltage detection unit 11 is read out from the register 28 at relatively long intervals in the same manner as the detection. The voltage detection operations by the voltage detection units 10 and 11 are performed in parallel.

According to the sixth specific example, the voltage detection unit 10 acquires the voltage detection value of each battery cell Cb at roughly the same coarse accuracy and timing as in the conventional art, and the voltage detection unit 11 acquires the voltage detection value of each battery cell Cb with the higher accuracy than the conventional art at relatively long period such as every 100 ms. That is, in this case, it is possible to perform highly accurate voltage detection while maintaining the conventional battery monitoring schedule.

The above-described embodiment provides the following effect.

The battery monitoring device 2 includes a range specifying unit 25 that specifies a detection range, which is a range for detecting the voltage of the battery cell Cb, and a characteristic setting unit 26 that sets the characteristics of the digital filters 14 and 17 included in the voltage detection units 10 and 11. According to the above configuration, the detection range of the voltage of the battery cell Cb can be selectively set to be any desired range from a wide range that is a wide area covering the entire voltage range of the battery cell Cb to a narrow range that is a limited narrow range of the entire voltage range.

Further, according to the above configuration, desired characteristics can be selectively set as the filter characteristics of the digital filters 14 and 17. In this way, the voltage of the battery cell Cb can be detected after setting an appropriate detection range and appropriate filter characteristics according to various conditions. Therefore, according to the present embodiment, it is possible to improve the accuracy of voltage detection of the battery cell Cb.

In this way, according to the present embodiment, which can further improve the voltage detection accuracy, the SOC estimation accuracy can be further improved, and even if the battery such as a LPF battery that has many flat regions relating to the relationship between the SOC and the OCV is the detection target, the SOC estimation can be performed with the practically sufficient accuracy. Therefore, according to the present embodiment, it is possible to more reliably perform the equalization process normally. Further, according to the present embodiment, the margin secured in the safe use area of the battery set for preventing the occurrence of over discharge and over charge is reduced, and the usable area is expanded by that amount, so that it is possible to use up the battery, and as a result, it is possible to obtain the effects of extending the driving distance of the vehicle and reducing the amount of battery mounted in the vehicle.

The range specifying unit 25 operates upon receiving a range specifying command given from the external ECU 3, and the characteristic setting unit 26 operates upon receiving a characteristic setting command given from the ECU 3. In other words, both the range specifying unit 25 and the characteristic setting unit 26 designate the detection range and set the filter characteristics based on commands given from the ECU 3. As described above, in the present embodiment, the detection range is specified and the filter characteristics are set by the combination of the battery monitoring device 2 and the ECU 3. Therefore, it is possible to detect the voltage of the battery cell Cb after setting an appropriate detection range and an appropriate filter characteristic according to each of various driving scenes, for example, when the vehicle is running, the vehicle is stopped, or the vehicle is being charged, so that it is possible to realize more accurate battery control.

The range specifying unit 25 can specify the detection range based on the cell voltage range predetermined for each type of battery cell Cb. For example, the range specifying unit 25 can specify a narrow range as the detection range in area where the SOC is close to 0% and an area where the SOC is close to 100%, and can specify a wide range as the detection range in other areas. In this way, in the area where the SOC is close to 0% and the area where the SOC is close to 100%, the accuracy of voltage detection is relatively high, and over discharge and over charge can be prevented from occurring. At the same time, in other regions, the voltage detection accuracy is relatively low accuracy, which is coarse accuracy, so that the time required for voltage detection and, in turn, the time required for SOC estimation can be shortened.

When the range specifying unit 25 specifies a relatively wide range as the detection range, the characteristic setting unit 26 sets the cutoff frequency, which is the filter characteristic, to a relatively high frequency. When the range specifying unit 25 specifies the relatively narrow range as the detection range, the characteristic setting unit 26 sets the cutoff frequency, which is the filter characteristic, to a relatively low frequency.

In this way, the conversion time is shortened when voltage is detected in a wide range, so that the detection time can be further shortened, and the noise removal performance is improved when the voltage is detected in a narrow range, so that the detection accuracy is further increased. According to the above configuration, when a large amount of noise occurs in the vehicle, such as when the vehicle is being charged, voltage detection is performed within a narrow range to improve the noise removal performance, thereby suppressing deterioration of the S/N ratio due to noise. As a result, the voltage detection accuracy can be improved.

The range specifying unit 25 can specify each detection range so that the detection range in the voltage detection unit 10 of the normal system and the detection range in the voltage detection unit 11 of the diagnosis system are the same range. Further, the characteristic setting unit 26 sets the characteristics so that the characteristics of the digital filter 14 provided in the voltage detection unit 10 of the normal system and the characteristics of the digital filter 17 provided in the voltage detection unit 11 of the diagnostic system are the same. In this way, the matching of the voltage acquisition timing of each battery cell Cb using the voltage detection units 10 and 11 is improved, and the matching of time constants of the digital filters 14 and 17 of the voltage detection units 10 and 11 is improved.

Therefore, according to the above configuration, even when the voltage across the terminals of each battery cell Cb fluctuates greatly, the voltage detection value of a certain battery cell Cb by the voltage detection unit 10 and the voltage detection value of the certain battery cell Cb by the voltage detection unit 11 can be substantially matched. As a result, the accuracy of fault diagnosis is improved. Furthermore, according to the above configuration, when a large noise occurs in the vehicle, if a narrow detection range is specified as the detection range for both the voltage detection units 10 and 11, the noise removal performance of both the normal system and the diagnostic system can be improved. As a result, the accuracy of fault diagnosis can be maintained well.

The range specifying unit 25 specifies a relatively wide range as the detection range of the voltage detection unit 10 in the normal system and specifies a relatively narrow range as the detection range of the voltage detection unit 11. According to the above feature, the voltage detection unit 10 acquires the voltage detection value of each battery cell Cb at roughly the same coarse accuracy and timing as in the conventional art, and the voltage detection unit 11 acquires the voltage detection value of each battery cell Cb with the higher accuracy than the conventional art at relatively long period such as every 100 ms. That is, according to the above configuration, it is possible to perform highly accurate voltage detection while maintaining the conventional battery monitoring schedule.

The voltages of the plurality of battery cells Cb forming the assembled battery 2 may not be completely the same, and may often have different voltage values. Therefore, the appropriate detection range for each battery cell Cb may not always be the same and may be different. Therefore, the range specifying unit 25 can specify the detection range independently for each battery cell Cb. In this way, voltage detection can be performed after setting an appropriate detection range for each battery cell Cb, and the accuracy of voltage detection for each battery cell Cb can be further improved.

The range specifying unit 25 can specify the detection range based on the type of battery cell Cb. For example, the range specifying unit 25 can switch the detection range so that the output voltages of the SC amplifier circuits 12 and 15 fall within the input voltage ranges of the ADCs 13 and 16 for each of the plurality of battery cells Cb having different voltage ranges. According to this, voltage detection is possible in the entire voltage range for each of the plurality of types of battery cells Cb.

The voltage detection units 10 and 11 sample the voltage of the battery cell Cb using the capacitors C11 and C12, and transfer the sampled charge via the capacitors C13 to C16 to output a voltage corresponding to the voltage of the battery cell Cb. It is provided with SC amplifier circuits 12 and 15 configured to be able to switch the amplification factor and the offset, and by switching one or both of the amplification factor and the offset of the SC amplifier circuits 12 and 15, the voltage of the battery cell Cb is detected in the detection range specified by the range specifying unit 25. According to such a configuration, the narrower the detection range of the voltage detection units 10 and 11, the higher the accuracy of voltage detection.

Second Embodiment

Figure 15:
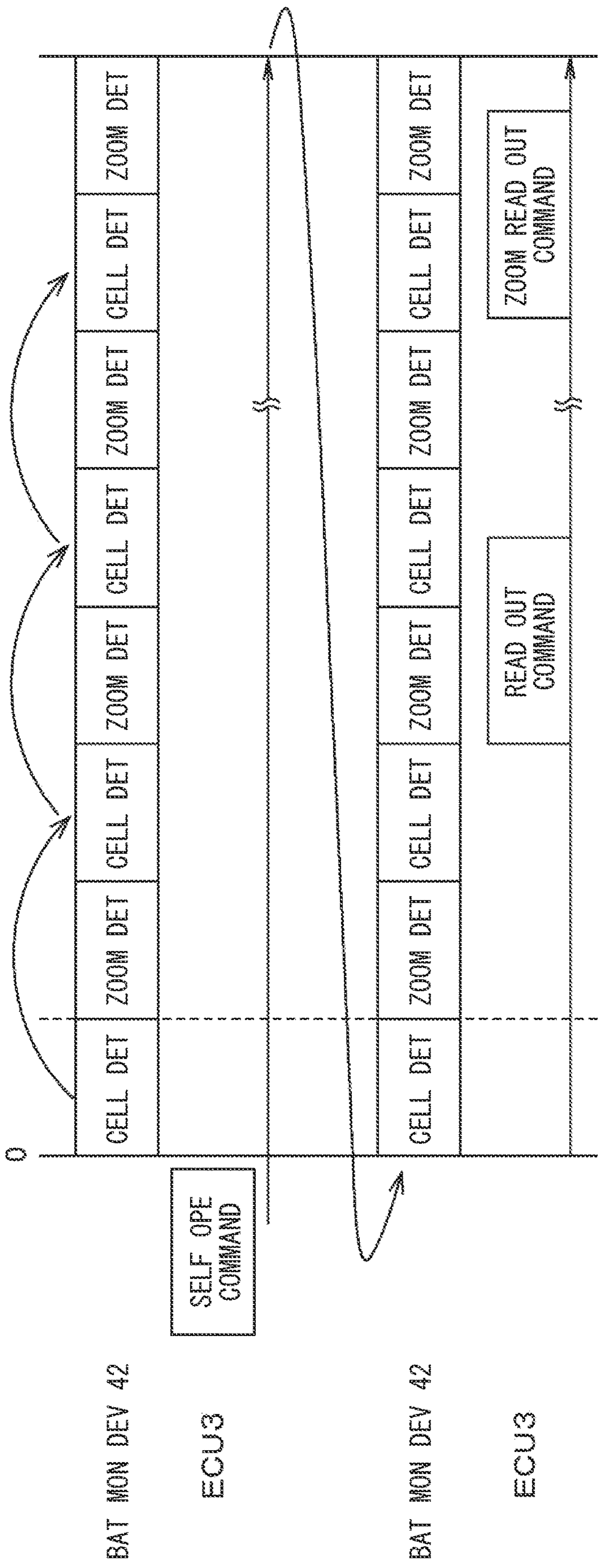
FIG. 15 is a diagram showing an example of the operation flow of the battery monitoring device according to the second embodiment.
Figure 16:
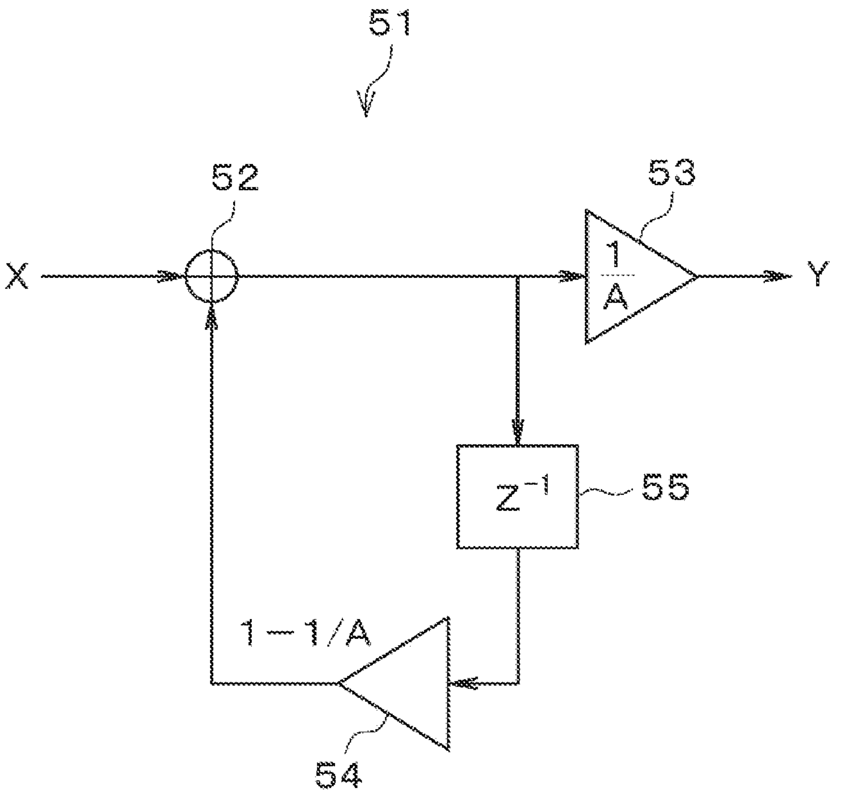
FIG. 16 is a diagram illustrating a specific configuration example of a digital filter according to the second embodiment.

The following will describe a second embodiment with reference to FIG. 14 to FIG. 16.

<Overall Configuration>

As shown in FIG. 14, the battery monitoring device 42 provided in the battery monitoring system 41 of the present embodiment differs from the battery monitoring device 2 of the first embodiment in that it includes a battery monitoring IC 43 instead of the battery monitoring IC 5. The battery monitoring IC 43 differs from the battery monitoring IC 5 in that it includes a control unit 44 instead of the control unit 8. The control unit 44 differs from the control unit 8 in that the unit 44 has a command generation unit 45 added to the controller 8, and has a range specifying unit 46 and a characteristic setting unit 47 instead of the range specifying unit 25 and the characteristic setting unit 26.

The command generation unit 45 generates a range specifying command and a characteristic setting command based on the voltage detection result by one or both of the voltage detection unit 10 and the voltage detection unit 11. Each command generated by the command generation unit 45 is similar to each command generated by the ECU 3 in the first embodiment. Therefore, the range specifying unit 46 operates upon receiving a range specifying command generated by the command generation unit 45, and the characteristic setting unit 47 operates upon receiving a characteristic setting command generated by the command generation unit 45. In this way, the control unit 44 of the battery monitoring IC 43 specifies the detection range and sets the filter characteristics based on its own determination, not on commands from the ECU 3.

In this case, the control unit 44 performs voltage detection by normal operation with a wide detection range, and then reads the result of the voltage detection over a wide range and with rough accuracy from the register 28. Then, the control unit 44 determines a necessary range based on the read voltage detection result, and sets an appropriate detection range and filter characteristics for the zoom operation with a narrow detection range. After that, the control unit 44 performs voltage detection by the zoom operation with the detection range and the filter characteristics set as described above. Hereinafter, such a series of operations will be referred to as self-determination operations. Note that the characteristics of the filter in the zoom operation may be set based on a command from the ECU 3.

<Flow of Operations by the Battery Monitoring Device>

Next, an example of the flow of operations performed by the battery monitoring device 42 configured as described above will be described with reference to FIG. 15. First, the ECU 3 transmits a "self-determination operation command". A "self-determination operation command" is a command for instructing execution of a self-determination operation. When receiving the "self-determination operation command", the battery monitoring device 42 starts the above-described self-determination operation. In this case, the self-determination operation is repeatedly executed. That is, in this case, the battery monitoring device 42 does not require transmission of a command from the ECU 3, and performs voltage detection by normal operation with a wide detection range, that is, "cell detection", and performs voltage detection by the zoom operation with a narrow detection range, that is, "zoom detection" alternately and periodically.

The battery monitoring device 42 executes voltage detection by normal operation and voltage detection by zoom operation a predetermined number of times through such self-determination operation. After that, when receiving the "read out command" from the ECU 3, the device 42 reads out the voltage detection result with the predetermined number of times from the register 28. In this case, the voltage detection result of the predetermined number of times is stored in the register 28 as a value obtained by averaging the voltage detection values of the predetermined number of times through the digital filters 14 and 17.

In order to realize the output of the values described above, as a specific configuration of the digital filters 14 and 17, for example, a first-order IIR filter circuit 51 as shown in FIG. 16 may be adopted. Note that IIR is an abbreviation for Infinite Impulse Response. The first-order IIR filter circuit 51 includes an adder 52, multipliers 53 and 54, and a delay device 55 provided between an input X and an output Y According to the digital filters 14 and 17 having such a configuration, it is possible to output a signal representing a moving average value of the voltage detection results of a predetermined number of times.

The battery monitoring device 42 of this embodiment described above can also perform the same operation as the battery monitoring device 42 of the first embodiment. Thus, the same effect as the first embodiment can be achieved in the present embodiment. Further, according to the present embodiment, the battery monitoring device 42 does not require a command from the ECU 3, and based on its own determination, adjusts the detection range and the filter characteristics in the zoom operation appropriately according to various situations.

Other Embodiments

The present disclosure is not limited to the embodiments that have been described above and illustrated in the drawings, but can arbitrarily be modified, combined, or expanded without departing from the spirit of the present disclosure.

The numerical values and the like shown in the embodiments described above are examples, and are not limited to those examples.

The specific configurations of the SC amplifier circuits 12 and 15 may not be limited to those described in each of the above embodiments, and may be changed as appropriate as long as they can achieve similar functions.

The battery monitoring device may not be limited to having the normal system voltage detection unit 10 and the diagnosis system voltage detection unit 11, and may be configured to have only one voltage detection unit.

While the present disclosure has been described with reference to embodiments thereof, it is to be understood that the disclosure is not limited to the embodiments and constructions. The present disclosure incorporates various modifications and variations within the scope of equivalents. In addition, various combinations and forms, and further, other combinations and forms including only one element, or more or less than these elements are also within the sprit and the scope of the present disclosure.

The controllers and methods described in the present disclosure may be implemented by a special purpose computer created by configuring a memory and a processor programmed to execute one or more particular functions embodied in computer programs. Alternatively, the controllers and methods described in the present disclosure may be implemented by a special purpose computer created by configuring a processor provided by one or more special purpose hardware logic circuits. Alternatively, the controllers and methods described in the present disclosure may be implemented by one or more special purpose computers created by configuring a combination of a memory and a processor programmed to execute one or more particular functions and a processor provided by one or more hardware logic circuits. The computer programs may be stored, as instructions being executed by a computer, in a tangible non-transitory computer-readable medium.

What is claimed is:

1. A battery monitoring device for monitoring an assembled battery having a configuration in which a plurality of battery cells are connected in series, the battery monitoring device comprising:

a range specifying unit that specifies a detection range for detecting a voltage of each battery cell;

a voltage detection unit that detects the voltage of each battery cell in the detection range, includes an A/D converter for inputting a voltage corresponding to the voltage of each battery cell and a digital filter for inputting a digital signal output from the A/D converter and functioning as a low pass filter, and outputs an output signal of the digital filter as a detection signal representing a detection result of the voltage of each battery cell; and a characteristic setting unit that sets a characteristic of the digital filter, wherein:

the range specifying unit specifies the detection range based on a cell voltage range predetermined for each type of the battery cells; and the range specifying unit selectively sets the detection range from a wide range that is a wide area covering a whole of the cell voltage range to a narrow range that is a limited narrow range of the whole of the cell voltage range.

2. The battery monitoring device according to claim 1, wherein:

the range specifying unit operates in response to a range specifying command input from an external control device; and the characteristic setting unit operates in response to a characteristic setting command input from the control device.

3. The battery monitoring device according to claim 1, further comprising:

a command generation unit that generates a range specifying command and a characteristic setting command based on the detection result of the voltage by the voltage detection unit;

the range specifying unit operates in response to the range specifying command; and the characteristic setting unit operates in response to the characteristic setting command.

4. The battery monitoring device according to claim 1, wherein:

when the range specifying unit specifies a relatively wide range as the detection range, the characteristic setting unit sets a cutoff frequency, which is the characteristic of the digital filter, to a relatively high frequency; and when the range specifying unit specifies a relatively narrow range as the detection range, the characteristic setting unit sets the cutoff frequency, which is the characteristic of the digital filter, to a relatively low frequency.

5. The battery monitoring device according to claim 1, wherein:

the voltage detection unit includes a first voltage detection unit and a second voltage detection unit having a same configuration as the first voltage detection unit;

the range specifying unit specifies each detection range of the first voltage detection unit and the second voltage detection unit to match the detection range of the first voltage detection unit with the detection range of the second voltage detection unit; and the characteristic setting unit sets each characteristic of the digital filter in the first voltage detection unit and the second voltage detection unit to match the characteristic of the digital filter provided in the first voltage detection unit with the characteristic of the digital filter provided in the second voltage detection unit.

6. The battery monitoring device according to claim 1, wherein:

the voltage detection unit includes a first voltage detection unit and a second voltage detection unit having a same configuration as the first voltage detection unit; and the range specifying unit specifies a relatively wide range as the detection range of the first voltage detection unit, and specifies a relatively narrow range as the detection range of the second voltage detection unit.

7. The battery monitoring device according to claim 1, wherein:

the range specifying unit specifies the detection range independently for each battery cell.

8. The battery monitoring device according to claim 1, wherein:

the voltage detection unit includes a switched capacitor amplifier circuit that includes a sampling capacitor and a feedback capacitor, samples the voltage of each battery cell using the sampling capacitor, outputs the voltage corresponding to the voltage of each battery cell by transferring a sampled charge via the feedback capacitor, and switches an amplification factor and an offset thereof; and the voltage detection unit detects the voltage of each battery cell in the detection range specified by the range specifying unit by switching one or both of the amplification factor and the offset of the switched capacitor amplifier circuit.

9. The battery monitoring device according to claim 8, wherein:

the switched capacitor amplifier circuit includes a capacitance value switching unit that switches one or both of a capacitance value of the sampling capacitor and a capacitance value of the feedback capacitor; and the voltage detection unit switches the amplification factor by switching the capacitance value using the capacitance value switching unit.

10. The battery monitoring device according to claim 8, wherein:

the switched capacitor amplifier circuit further includes a transfer number switching unit that switches a numerical number of transfer times of the sampled charge; and the voltage detection unit switches the amplification factor by switching the numerical number of transfer times using the transfer number switching unit.

* * * * *